(12) United States Patent
Ohnuma et al.

(10) Patent No.: US 6,893,503 B1
(45) Date of Patent: May 17, 2005

(54) METHOD OF MANUFACTURING A SEMICONDUCTOR DEVICE

(75) Inventors: Hideto Ohnuma, Kanagawa (JP); Shunpei Yamazaki, Tokyo (JP); Setsuo Nakajima, Kanagawa (JP); Hisashi Ohtani, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 09/050,182

(22) Filed: Mar. 26, 1998

(30) Foreign Application Priority Data

Mar. 27, 1997 (JP) .............................. 9-094607

(51) Int. Cl.$^7$ .............................................. C30B 25/04
(52) U.S. Cl. ............................ 117/94; 117/95; 117/97; 117/101; 117/102; 117/106
(58) Field of Search .......................... 117/94, 106, 95, 117/97, 101, 102

(56) References Cited

U.S. PATENT DOCUMENTS

| | | | |
|---|---|---|---|
| 5,244,819 A | 9/1993 | Yue | |
| 5,403,772 A | 4/1995 | Zhang et al. | |
| 5,426,064 A | 6/1995 | Zhang et al. | |
| 5,481,121 A | 1/1996 | Zhang et al. | |
| 5,488,000 A | 1/1996 | Zhang et al. | |
| 5,492,843 A | 2/1996 | Adachi et al. | |
| 5,501,989 A | 3/1996 | Takayama et al. | |
| 5,508,533 A | 4/1996 | Takemura | |
| 5,529,937 A | 6/1996 | Zhang et al. | |
| 5,534,716 A | 7/1996 | Takemura | |
| 5,543,352 A | 8/1996 | Ohtani et al. | |
| 5,563,426 A | 10/1996 | Zhang et al. | |
| 5,569,610 A | 10/1996 | Zhang et al. | |
| 5,569,936 A | * 10/1996 | Zhang et al. | ................. 257/66 |
| 5,580,792 A | 12/1996 | Zhang et al. | |
| 5,585,291 A | 12/1996 | Ohtani et al. | |
| 5,589,694 A | 12/1996 | Takayama et al. | |
| 5,595,923 A | 1/1997 | Zhang et al. | |
| 5,595,944 A | 1/1997 | Zhang et al. | |
| 5,604,360 A | 2/1997 | Zhang et al. | |
| 5,605,846 A | 2/1997 | Ohtani et al. | |
| 5,606,179 A | 2/1997 | Yamazaki et al. | |
| 5,608,232 A | 3/1997 | Yamazaki et al. | |
| 5,612,250 A | 3/1997 | Ohtani et al. | |
| 5,614,426 A | 3/1997 | Funada et al. | |
| 5,614,733 A | 3/1997 | Zhang et al. | |
| 5,616,506 A | 4/1997 | Takemura | |
| 5,620,910 A | 4/1997 | Teramoto | |
| 5,621,224 A | 4/1997 | Yamazaki et al. | |
| 5,624,851 A | 4/1997 | Takayama et al. | |
| 5,637,515 A | 6/1997 | Takemura | |
| 5,639,698 A | 6/1997 | Yamazaki et al. | |
| 5,643,826 A | 7/1997 | Ohtani et al. | |

(Continued)

FOREIGN PATENT DOCUMENTS

| | | |
|---|---|---|
| JP | 5-109737 | 4/1993 |
| JP | 08-330602 | 12/1996 |
| JP | 08-340127 | 12/1996 |
| JP | 09-045616 | 2/1997 |

*Primary Examiner*—Robert Kunemund
(74) *Attorney, Agent, or Firm*—Fish & Richardson P.C.

(57) ABSTRACT

A method of producing a semiconductor device which removes catalyst elements from a silicon-containing semiconductor film while maintaining the advantage of low temperature process is provided. The method comprises the steps of: forming an amorphous semiconductor film containing silicon on a glass substrate to crystallize it by using a catalyst element; selectively introducing into the amorphous semiconductor film an impurity belonging to Group 15 to form gettering regions and regions to be gettered; and causing the catalyst element in the silicon film to move to the gettering regions by heat treatment. Through the gettering process, the crystalline silicon film can be obtained in which the concentration of nickel contained therein is sufficiently reduced.

100 Claims, 18 Drawing Sheets

U.S. PATENT DOCUMENTS

| | | | |
|---|---|---|---|
| 5,646,424 A | 7/1997 | Zhang et al. | |
| 5,654,203 A | 8/1997 | Ohtani et al. | |
| 5,656,825 A | 8/1997 | Kusumoto et al. | |
| 5,663,077 A | 9/1997 | Adachi et al. | |
| 5,677,549 A | 10/1997 | Takayama et al. | |
| 5,696,386 A | 12/1997 | Yamazaki | |
| 5,696,388 A | 12/1997 | Funada et al. | |
| 5,700,333 A | * 12/1997 | Yamazaki et al. | 136/258 |
| 5,705,829 A | 1/1998 | Miyanaga et al. | |
| 5,712,191 A | 1/1998 | Nakajima et al. | |
| 5,744,822 A | * 4/1998 | Takayama et al. | 257/66 |
| 5,744,824 A | 4/1998 | Kousai et al. | |
| 5,756,364 A | 5/1998 | Tanaka et al. | |
| 5,766,977 A | 6/1998 | Yamazaki | |
| 5,773,327 A | 6/1998 | Yamazaki et al. | |
| 5,773,846 A | * 6/1998 | Zhang et al. | 257/66 |
| 5,773,847 A | 6/1998 | Hayakawa | |
| 5,783,468 A | 7/1998 | Zhang et al. | |
| 5,795,795 A | * 8/1998 | Kousai et al. | 117/94 |
| 5,808,321 A | 9/1998 | Mitanaga et al. | |
| 5,811,327 A | 9/1998 | Funai et al. | |
| 5,814,540 A | 9/1998 | Takemura et al. | |
| 5,818,076 A | 10/1998 | Zhang et al. | |
| 5,821,138 A | 10/1998 | Yamazaki et al. | |
| 5,824,573 A | 10/1998 | Zhang et al. | |
| 5,824,574 A | 10/1998 | Yamazaki et al. | |
| 5,830,784 A | 11/1998 | Zhang et al. | |
| 5,837,619 A | 11/1998 | Adachi et al. | |
| 5,840,118 A | 11/1998 | Yamazaki | |
| 5,843,225 A | 12/1998 | Takayama et al. | |
| 5,843,833 A | 12/1998 | Ohtani et al. | |
| 5,851,862 A | 12/1998 | Ohtani et al. | |
| 5,858,823 A | 1/1999 | Yamazaki et al. | |
| 5,869,362 A | 2/1999 | Ohtani | |
| 5,869,363 A | 2/1999 | Yamazaki et al. | |
| 5,879,977 A | 3/1999 | Zhang et al. | |
| 5,882,960 A | 3/1999 | Zhang et al. | |
| 5,886,366 A | 3/1999 | Yamazaki et al. | |
| 5,888,857 A | 3/1999 | Zhang et al. | |
| 5,888,858 A | 3/1999 | Yamazaki et al. | |
| 5,895,933 A | 4/1999 | Zhang et al. | |
| 5,897,347 A | 4/1999 | Yamazaki et al. | |
| 5,904,770 A | 5/1999 | Ohtani et al. | |
| 5,915,174 A | 6/1999 | Yamazaki et al. | |
| 5,923,962 A | 7/1999 | Ohtani et al. | |
| 5,923,997 A | 7/1999 | Mitanaga et al. | |
| 5,929,464 A | 7/1999 | Yamazaki et al. | |
| 5,932,893 A | 8/1999 | Miyanaga et al. | |
| 5,937,282 A | 8/1999 | Nakajima et al. | |
| 5,940,690 A | 8/1999 | Kusumoto et al. | |
| 5,942,768 A | 8/1999 | Zhang | |
| 5,946,560 A | 8/1999 | Uochi et al. | |
| 5,949,115 A | 9/1999 | Yamazaki et al. | |
| 5,953,597 A | 9/1999 | Kusumoto et al. | |
| 5,956,579 A | 9/1999 | Yamazaki et al. | |
| 5,961,743 A | 10/1999 | Yamazaki et al. | |
| 6,251,712 B1 | 6/2001 | Tanaka et al. | |
| 6,355,509 B1 | 3/2002 | Yamazaki | |

\* cited by examiner

Addition of Impurity Ions which Impart N-Type Conductivity
(Formation of n⁻ Region/n⁺ Region)

Addition of Impurity Ions for Imparting P-Type Conductivity
(Formation of p⁻ Region/p⁺ Region)

N-Channel Type TFT      P-Channel Type TFT

METHOD OF MANUFACTURING A SEMICONDUCTOR DEVICE

BACKGROUND OF THE INVENTION

1. Field of the Invention

The present invention relates to a method of manufacturing a semiconductor device using a semiconductor thin film, and particularly to method of manufacturing a thin film transistor (TFT) using a crystalline semiconductor film containing silicon.

Incidentally, the term "semiconductor device" used in the present specification includes all devices functioning by using a semiconductor, and not only a single element such as a TFT, but also an electro-optical device and application products furnished with the same are also included in the category of the semiconductor device.

2. Description of the Related Art

In recent years, a technique of constituting a semiconductor circuit by forming TFTs on a glass substrate and the like, has been rapidly developed. As such a semiconductor circuit, an electro-optical device such as an active matrix type liquid crystal display device is typical.

The active matrix type liquid crystal display device is a monolithic display device in which a pixel matrix circuit and a driver circuit are provided on the same substrate. Furthermore, a system-on-panel having additional built-in logic circuits such as a memory circuit and a clock generation circuit has also been developed.

Since such a driver circuit and a logic circuit are required to be operated at high speed, it is not suitable to use a noncrystalline silicon film (amorphous silicon film) as an active layer. Thus, under the present circumstances, a TFT using a crystalline silicon film (polysilicon film) as an active layer has become the main stream.

The present inventors disclose a technique for obtaining a crystalline silicon film on the glass substrate in Japanese Patent Application Laid-open No. Hei 7-130652. In the technique disclosed in the publication, a catalyst element for promoting crystallization is added into an amorphous film, and by carrying out a heat treatment, a crystalline silicon film is formed.

This technique can lower the crystallization temperature of the amorphous silicon film by the action of the catalyst element drastically by 50 to 100° C., and the time required for crystallization can also be reduced to ⅕ to ⅒. Further, it is experimentally confirmed that the crystalline silicon film obtained by this technique exhibits excellent crystallinity.

As the above-mentioned catalyst elements, a metal element such as nickel or cobalt is used. Since such a metal element forms a deep level in a silicon film to capture a carrier, there is a fear that the metal element has a bad influence to the electrical characteristics and reliability of a TFT.

Further, the catalyst elements remaining in the active layer of the TFT are confirmed to cause irregular segregation. The present inventors suspected that such a segregated region forms a leak path of weak current, and that it causes an abrupt increase of OFF current (i.e., the current when TFT is in OFF state).

Accordingly, it is preferred that, after the crystallization, the catalyst elements are rapidly removed or reduced to such a low level that they may not influence the electrical characteristics. The present inventors have already filed a patent application in which gettering effect of a halogen element is utilized as a means therefor.

However, since the method proposed above requires a heat treatment at a temperature as high as 800° C. or higher, a glass substrate with a low thermal resistance may not be used. That is, the advantage of employing the low temperature process using catalyst elements cannot be effectively utilized.

SUMMARY OF THE INVENTION

The present invention have been proposed under such circumstances, and an object of the present invention is to provide a technique to remove or reduce catalyst elements from a crystalline silicon-containing semiconductor film while using a feature of the low temperature process.

According to one aspect of the present invention, a method of manufacturing a semiconductor device is comprised of:

a first step of forming an amorphous semiconductor film containing silicon on a substrate having an insulating surface;

a second step of introducing into the amorphous semiconductor film a catalyst element for promoting the crystallization of the amorphous semiconductor film;

a third step of crystallizing the amorphous semiconductor film by a heat treatment;

a fourth step of selectively introducing into the silicon-containing semiconductor film obtained in the third step an impurity element belonging to Group 15; and a fifth step of gettering the catalyst element by heat treatment to the region into which the impurity element is introduced; and is characterized in that:

the heat treatment in the fifth step is performed in the temperature range not exceeding the glass transition point of the substrate.

According to another aspect of the present invention, a method of manufacturing a semiconductor device is comprised of:

a first step of forming an amorphous semiconductor film containing silicon on a substrate having an insulating surface;

a second step of selectively introducing into the amorphous semiconductor film a catalyst element for promoting the crystallization of the amorphous semiconductor film;

a third step of crystallizing at least a part of the amorphous semiconductor film by a heat treatment;

a fourth step of selectively introducing into the silicon-containing semiconductor film obtained in the third step, an impurity element belonging to Group 15; and a fifth step of gettering the catalyst element by heat treatment to the region into which the impurity element is introduced; and is characterized in that:

the heat treatment in the fifth step is performed in the temperature range not exceeding the glass transition point of the substrate.

Incidentally, between the step of crystallizing the amorphous semiconductor film and the step of introducing an impurity element belonging to Group 15, it can be provided with a step of irradiating a laser light or an intense light to the semiconductor film.

A basic object of the present invention is to remove the catalyst element used for the crystallization of the silicon-containing amorphous semiconductor film from the crystalline semiconductor film, and this is accomplished by utilizing the gettering effect of an element selected from those belonging to Group 15.

As a representative element for use as the catalyst element above, included are Ni (nickel), Co (cobalt), Fe (iron), Pd (palladium), Pt (platinum), Cu (copper), and Au (gold). According to the experiments conducted by the present inventors, it is found that nickel is most suitable for use as the catalyst element.

As the elements belonging to Group 15 for use in the gettering of the aforementioned catalyst elements, there are exemplified N (nitrogen), P (phosphorus), As (arsenic), Sb (antimony), and Bi (bismuth). However, most effective one among them is phosphorus.

A typical example is the case where nickel is used as the catalyst element and phosphorus is used as the gettering element (an element belonging to Group 15). In such a case, phosphorus and nickel exhibit a stable bonding state when being subjected to a heat treatment at about 600° C. Possible bonding states in this occasion are $Ni_3P$, $Ni_5P_2$, $Ni_2P$, $Ni_3P_2$, $Ni_2P_3$, $NiP_2$, and $NiP_3$.

As described in the foregoing, in case that nickel is used as the catalyst element for promoting the crystallization of a silicon-containing amorphous semiconductor film, gettering of nickel is possible by the function of phosphorus, i.e., an element belonging to Group 15. Thus, by using this effect, it is possible to remove or to reduce a catalyst element from the crystalline semiconductor film.

In general, because the catalyst elements (metal elements) above take a stable state in a grain boundary, they tend to segregate in a grain boundary. For instance, the above characteristic is used for gettering metal elements from a single crystalline silicon.

In contrast to the above case, it should be noted that, the object of the present invention is to remove the catalyst elements from a crystalline semiconductor film having the crystal boundaries above. This concept has never been found in prior art technique, and is therefore the characteristic point of the present invention.

DETAILED DESCRIPTION OF THE PREFERRED EMBODIMENTS

The present invention is described in further detail by making reference to FIGS. 2A to 2F, and to Examples below.

First, a silicon-containing amorphous silicon film 203 is formed on a glass substrate, and a crystalline silicon-containing semiconductor film 205 is obtained therefrom by heat treatment utilizing a catalyst element (such as nickel). Then, by irradiating a laser light to the crystalline semiconductor film 205, a crystalline semiconductor film 206 having an improved crystallinity can be obtained.

Figure 2A:
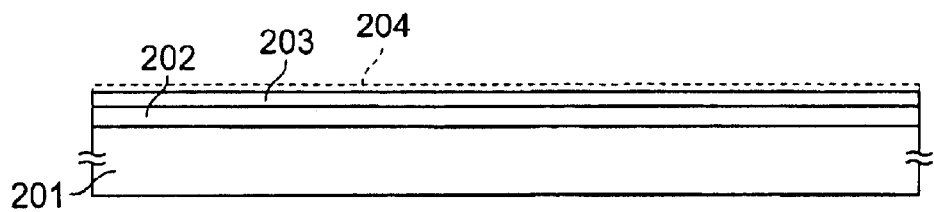
FIGS. 2A to 2F are explanatory views showing the gettering process.
Figure 2B:
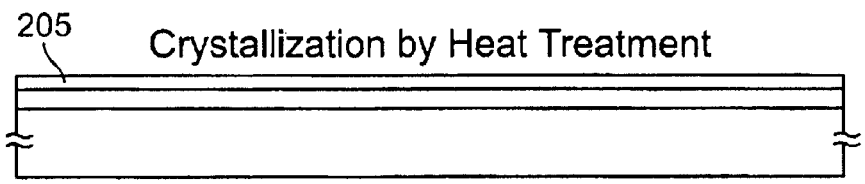
Figure 2C:
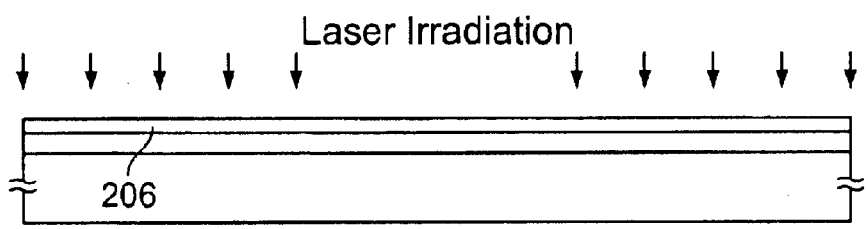
Figure 2D:
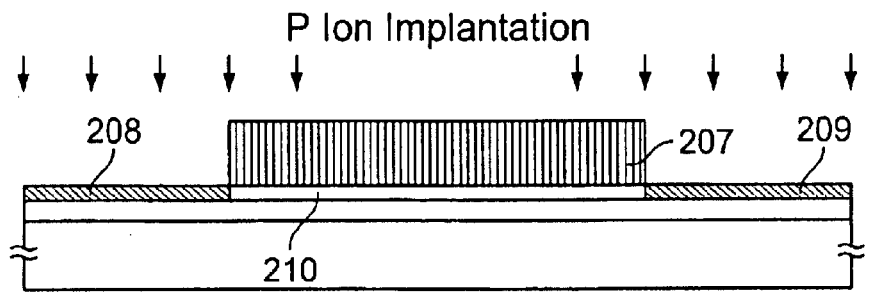

Then, a region whose concentration of the catalyst element is to be reduced (i.e., the region to be gettered) is covered with a resist mask 207, and a doping step of the implantation of phosphorus (P) is performed as is shown in FIG. 2D. Thus, regions containing phosphorus in high concentration (gettering regions) 208 and 209 are formed as well as the region to be gettered 210.

A heat treatment for gettering is performed after removing the resist mask 207, and the catalyst element that is present in the region to be gettered 210 is allowed to move to the gettering regions 208 and 209.

Finally, the region to be gettered 210 alone is patterned to selectively leave it over, and thus is obtained a crystalline semiconductor film 211 sufficiently lowered in the concentration of the catalyst element.

EXAMPLE 1

The present example describes a means in which P (phosphorus) is used for gettering nickel from a crystalline silicon film (polysilicon film) crystallized by using nickel as the catalyst element and the effect thereof.

Referring first to FIG. 2A, a 200 nm thick silicon oxide film 202 was formed as a base film by means of plasma CVD on a glass substrate 201. Then, a 50 nm thick amorphous silicon film 203 was formed by low pressure thermal CVD (or by plasma CVD). An amorphous silicon film formed at a thickness of from 10 to 75 nm (preferably from 15 to 45 nm) is sufficient.

Otherwise, an amorphous semiconductor film containing silicon, such as $Si_xGe_{1-x}$ (where 0<x<1), can be used in the place of the amorphous silicon film.

The crystallization of the amorphous silicon film 203 was performed thereafter. For the details of the process conditions, reference can be made to the description of Example 1 in Japanese Patent Application Laid-open No. Hei 8-130652.

Then, an ultra-thin oxide film (not shown) was formed on the surface of the amorphous silicon film 203 by irradiating UV light under oxygen atmosphere. The function of this oxide film is to improve the wettability of the amorphous silicon film for the nickel-containing solution that is to be applied thereon.

Subsequently, a nickel acetate solution containing 10 ppm (by weight) of nickel was applied to the resulting structure. By blowing off and thereby removing the solution that had been applied in excess by using a spin coater, an ultra-thin nickel-containing layer 204 was formed on the surface of the amorphous silicon film 203.

Once a structure shown in FIG. 2A is obtained, a heat treatment at 600° C. under gaseous nitrogen was performed for 4 hours to crystallize the amorphous silicon film 203. This crystallization step provides a crystalline silicon film 205 (FIG. 2B).

A polycrystalline silicon film (polysilicon film) having grain boundaries is available by following the crystallization step described above. However, a microcrystalline silicon film obtainable under conditions differing from those described above is also acceptable.

The heat treatment described above can be performed in the temperature range of from 550 to 700° C. (preferably, 550 to 650° C.) in an electric furnace. In this case, the upper limit of the heating temperature must be set by taking the thermal resistance of the glass substrate into consideration; hence, it must be set lower than the glass transition point of the glass substrate. If the heat treatment should be effected at a temperature exceeding the glass transition point, warping, shrinking, etc., apparently occurs on the glass substrate.

The heat treatment described above is performed by furnace annealing (heat treatment in an electric furnace). However, it is also possible to utilize heating means such as laser annealing or lamp annealing.

Then, a crystalline silicon film 206 having an improved crystallinity was obtained by irradiating a laser light to the thus obtained crystalline silicon film 205. In the present example, a KrF excimer laser (having a wavelength of 248 nm) was used, but also usable are, for example, a XeCl excimer laser or a YAG laser (FIG. 2C).

The excimer laser used in the present example is of pulse radiation type. Thus, fusion and solidification occur instantaneously and repeatedly on the region irradiated with the laser. That is, a non-equilibrium state is formed by the irradiation of an excimer laser, and it realizes a state in which nickel is rendered highly mobile.

The crystalline silicon film 205 obtained in the crystallization step with reference to FIG. 2B comprises an irregularly remaining amorphous component. However, the irradiation of a laser light completely crystallizes such remaining amorphous component. Thus, the crystallinity can be considerably improved. Still, it is also possible to omit this step of laser irradiation.

Upon completion of laser light irradiation, the oxide film on the surface of the crystalline silicon film 206 was once removed, and a thin oxide film (not shown) was formed again. This oxide film can be obtained by irradiating UV light under gaseous oxygen., A resist mask 207 was formed on the resulting structure. The oxide film described above is effective in increasing adhesiveness of the resist mask 207.

Then, the step of doping P (phosphorus) was performed by plasma doping (or ion implantation). Doping can be effected by setting the RF power to 20 W and an accelerating voltage in a range of from 5 to 30 keV (representatively at 10 keV), and setting the dose of phosphorus to $1\times10^{13}$ ions/cm$^2$ or higher (preferably, in a range of from $5\times10^{13}$ ions/cm$^2$ to $5\times10^{14}$ ions/cm$^2$).

As is described hereinafter, the optimal conditions for implanting phosphorus by doping change depending on the conditions for heat treatment that is performed in the later steps of gettering. Thus, the optimal conditions must be set from the process and the economical points of view. At present, the present inventors believe it favorable to set the accelerating voltage to 10 keV, and the dose to a range of from $1\times10^{14}$ ions/cm$^2$ to $5\times10^{14}$ ions/cm$^2$.

In the present invention, the doping step of phosphorus is performed preferably by setting such conditions that the concentration of phosphorus become a digit higher than the concentration of nickel remaining in the crystalline silicon film 206. The dose of $5\times10^{14}$ ions/cm$^2$ described above corresponds to the concentration of about $4\times10^{20}$ atoms/cm$^3$.

According to the measurement of the present inventors, the maximum concentration of remaining nickel in the crystalline silicon film 206 upon completion of the process step with reference to FIG. 2B is about $1\times10^{19}$ atoms/cm$^3$. Thus, in this case, the doping conditions can be set as such that phosphorus may remain in the film at a concentration of about $1\times10^{20}$ atoms/cm$^3$ or higher.

The doping of phosphorus is effected to the region 208 and 209 (hereinafter referred to as "gettering regions") shown in FIG. 2D. As a result of this doping process, the gettering regions 208 and 209 become regions containing phosphorus at high concentration. These regions are then rendered amorphous by the impact of the bombarded ions that are doped thereunto.

The region 210 (hereinafter referred to as "region to be gettered") remains undoped because it is protected by a resist mask 207. Thus, it becomes a region maintaining the crystallinity it acquired at the point of film formation.

Figure 2E:
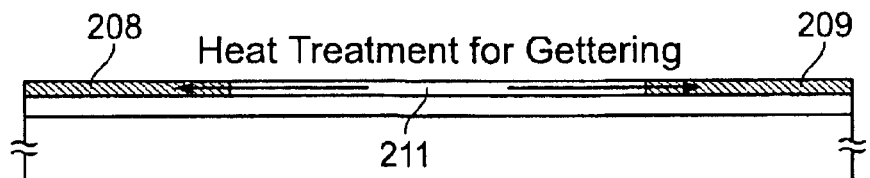

Upon completion of the doping of phosphorus, and after removing the resist mask 207, heat treatment for gettering was performed. Thus, nickel remaining inside the region to be gettered 210 is allowed to move to the gettering regions 208 and 209. Thus, a region to be gettered 211 reduced in concentration of nickel can be obtained (FIG. 2E).

The heat treatment described above can be effected under an inert atmosphere, gaseous hydrogen, an oxidizing atmosphere, or an oxidizing atmosphere containing a halogen element, and at a temperature range of 500° C. or higher (preferably, in a temperature range of from 550 to 650° C.). The duration of this heat treatment is 2 hours or longer (preferably, 4 to 12 hours).

As is stated hereinafter, the gettering efficiency greatly changes depending on the temperature and the time duration of the heat treatment. That is, similar to the doping conditions of phosphorus described above, the optimal conditions must be set from the process and the economical points of view each time the treatment is effected.

At present, the inventors believe it favorable to perform furnace annealing representatively at a temperature of 600° C. and for about 8 hours.

By effecting the heat treatment process described above, nickel remaining inside the region to be gettered 210 is led to the gettering regions 208 and 209 (to the direction indicated by an arrow). This movement of nickel is accelerated by the aforementioned effect of laser which mobilizes nickel, and by the effect that the gettering regions 208 and 209 are rendered amorphous.

Figure 2F:
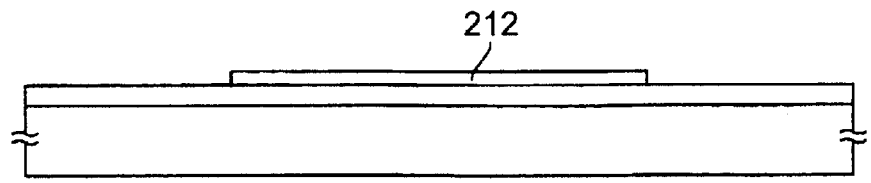
Figure 3A:
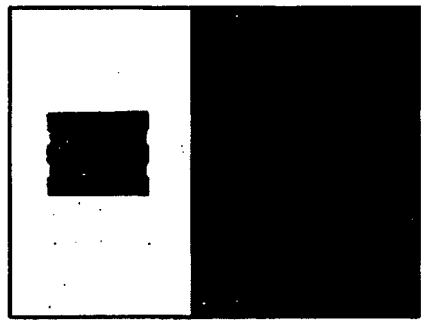
FIGS. 3A to 3F are photographs showing time duration dependence of a gettering process.
Figure 3B:
Figure 3C:
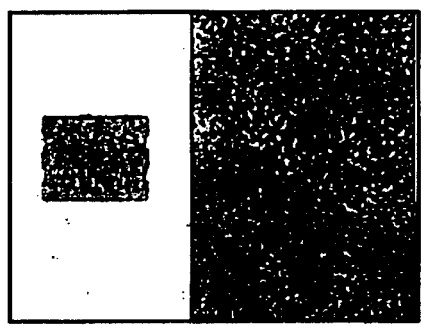
Figure 3D:
Figure 3E:
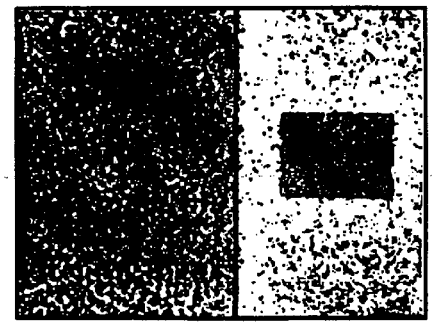
Figure 3F:
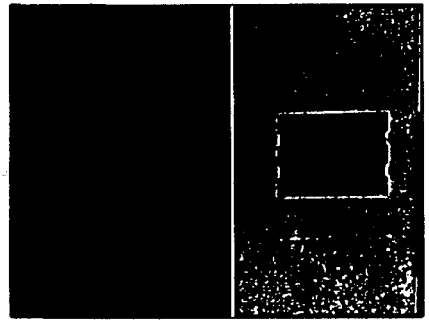

Thus, island-like pattern 212 sufficiently lowered in nickel concentration was obtained by removing the gettering regions 208 and 209 by patterning. In the region to be gettered 211 shown in FIG. 2E, the peripheral region in contact with the gettering regions 208 and 209 is preferably removed at the patterning, because it may contain nickel at a high concentration (FIG. 2F).

<Process Conditions for the Examples According to the Present Invention>

The constitutional requirements of the present invention are (1) a step of crystallizing a silicon-containing amorphous silicon film by using a catalyst element (e.g., nickel); (2) a step of forming a gettering region by selectively doping an element belonging to Group 15 (such as phosphorus); and (3) a step of moving the catalyst element remaining in the region to be gettered to a gettering region by effecting a heat treatment.

In the requirement steps described above, steps (2) and (3) are particularly in connection with the greatest object of the present invention, i.e., the "gettering of catalyst elements using phosphorus". In these steps, the representative parameters to be considered are the four points as follows:

(a) process temperature for the heat treatment to effect gettering;
(b) process duration for the heat treatment to effect gettering;
(c) dose of phosphorus in the implantation step; and
(d) accelerating voltage employed in the implantation of phosphorus.

The present invention is established by mutual relation of the parameters described above, and if a parameter is changed, the optimal values for rest of the parameters also change accordingly. Thus, the experiments performed by the present inventors and the findings acquired therefrom are described below.

The temperature dependence of the parameter is described first for the case where doping step is performed at an accelerating voltage of 30 keV and a dose of $5\times10^{14}$ ions/cm$^2$, and at a fixed process duration of 2 hours. The photographs of FIGS. 6A to 6F each show the experimental results obtained for a non-annealed sample and the samples annealed at 400° C., 450° C., 500° C., 550° C., and 600° C., respectively.

In the experiment, the number of holes that generate after selectively removing nickel (assumably nickel silicide) that remain in the region to be gettered was evaluated. The holes generate when the sample is immersed into an etchant called as FPM (a 1:1 (by molar) mixture of HF and $H_2O_2$) for an hour at room temperature. That is, the higher the degree of generating holes, the higher the concentration of remaining nickel.

Figure 4:
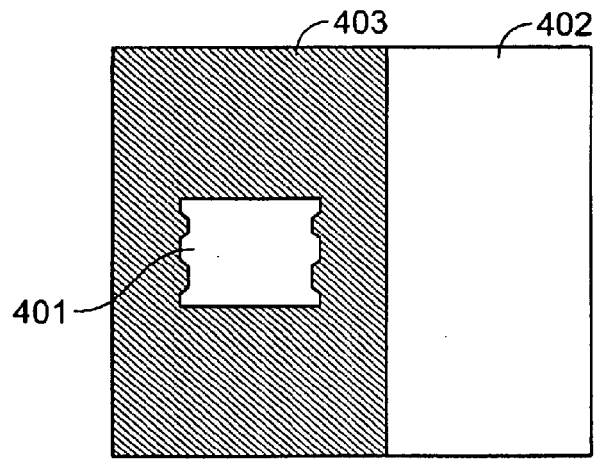
FIG. 4 is a schematic diagram of a photograph showing a pattern of 160×200 µm.

In the present experiment, the pattern 160×200 μm in size located in the central left of the photograph (referred to hereinafter as "observed pattern") was observed. This photograph can be shown schematically as in FIG. 4. In FIG. 4 are shown the regions to be gettered 401 and 402, as well as the gettering region 403. The observed pattern corresponds to the region 401.

Referring to the photographs of FIGS. 6A to 6F, it can be seen clearly that the number of holes inside the observed pattern decreases with increasing temperature. This indicates that the gettering efficiency increases with elevating temperature for the gettering.

Figure 7:
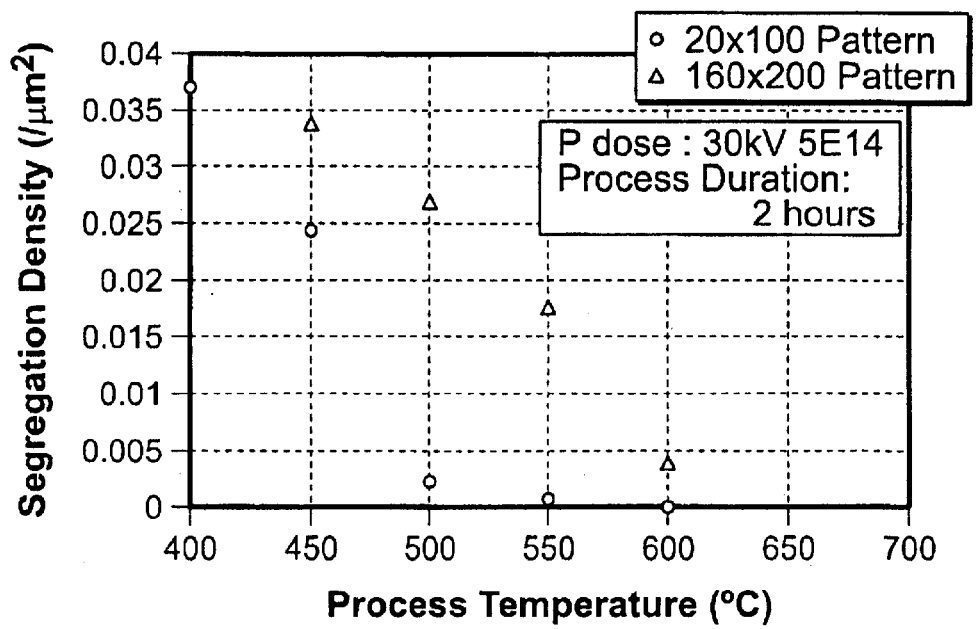
FIG. 7 is a graph showing the relation between the gettering temperature and the segregation density.

The tendency described above is summarized in FIG. 7. In the graph of FIG. 7, the abscissa shows the process temperature, and the segregation density is taken in the ordinate.

The segregation density referred herein corresponds to the number of holes that are present per unit area. However, gettering efficiency is not an absolute value because the tendency differs depending on the shape of the gettering region. Accordingly, the segregation density in the present experiment is simply used as an index which represent the temperature dependence of the gettering efficiency.

FIG. 7 shows the results obtained for a pattern 160×200 μm in size, and for reference, the results obtained for a pattern 20×100 μm in size. In both of the results, it can be seen that the segregation density decreases with increasing temperature. Particularly in the pattern 20×100 μm in size, it can be seen that the segregation density tends to decrease more abruptly than in the pattern of 160×200 μm in size.

Thus, from the results obtained on the pattern 160×200 μm in size, i.e., the object to be evaluated in the present experiment, it was found that a better result is obtained with a higher process temperature in case doping is performed at an accelerating voltage of 30 keV and at a dose of $5\times10^{14}$ ions/cm$^2$, and at a fixed process duration of 2 hours. More specifically, a process temperature of 600° C. or higher is preferred.

The gettering effect using phosphorus depend on the distance between the gettering region and the region to be gettered. This is attributed to the fact that the gettering phenomenon proceeds by the movement of nickel in the direction in parallel with the film plane.

In case of the pattern of 160×200 μm in size, the shorter edge has a length of 160 μm, and the distance between the center of the pattern and the edge portion corresponds to the distance between the gettering region and the region to be gettered. This signifies that the results obtained in the experiment described above is applicable for at least a distance of 160 μm or less. Furthermore, from the observed results on other patterns, it is expected that results similar to that obtained in the present experiment can be obtained practically to a distance of about 200 to 250 μm.

An active layer 160×200 μm in size not only belongs to an active layer pattern of a TFT which practically constitutes an active matrix type display device, but is particularly suitable for large-size TFTs. Thus, the findings obtained from the experimental results is applicable to substantially all TFTs constituting an active matrix type display device.

An active layer of a size having a shorter edge of 200 μm or longer is used only in limited uses such as a TFT constituting a driver circuit. In such a case, however, inconveniences can be easily circumvented by, for instance, dividing the active layer into a plurality of portions. Furthermore, as is clearly understood from the results for a 20×100 μm pattern in FIG. 7, a more distinct gettering effect can be achieved at lower temperatures with decreasing length of the shorter edge.

Then, the present inventors set the upper limit of the process temperature to 600° C. to investigate the process duration dependence of the segregation density taking the heat-resistance of glass substrate into consideration. In this experiment, the process temperature was fixed to 600° C., while also fixing the doping conditions to an accelerating voltage of 30 keV and a dose of $5\times10^{14}$ ions/cm$^2$.

The photographs of FIGS. 3A to 3F each show the experimental results obtained for a non-annealed sample and the samples annealed for 1 hour, 2 hours, 4 hours, 8 hours, and 24 hours, respectively. The object of observation was a pattern (160×200 μm in size) similar to that described in the experiment for investigating the temperature dependence, and holes were observed and segregation densities were obtained for the evaluation.

Referring to the photographs of FIGS. 3A to 3F, it can be seen clearly that the number of holes which generate in the region to be gettered decreases with increasing process duration. In particular, completely no holes generate at a process duration of 24 hours.

The final objective of the present inventors in this experiment is to find the conditions under which no holes generate when FPM treatment is performed. Thus, only the case at which the process duration was set to 24 hours was the condition capable of obtaining the objective crystalline silicon film.

Figure 5:
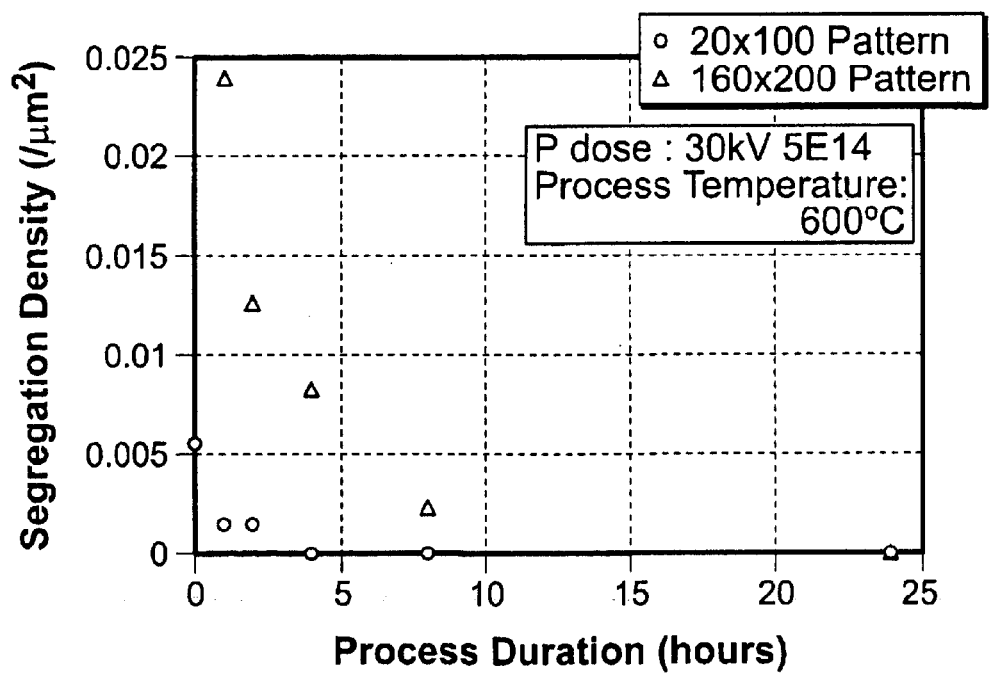
FIG. 5 is a graph showing the relation between the duration of gettering and the segregation density.
Figure 6A:
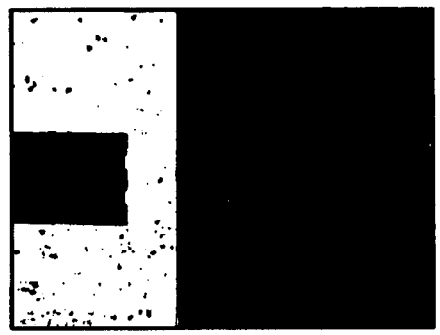
FIGS. 6A to 6F are photographs showing the temperature dependence of the gettering process.
Figure 6B:
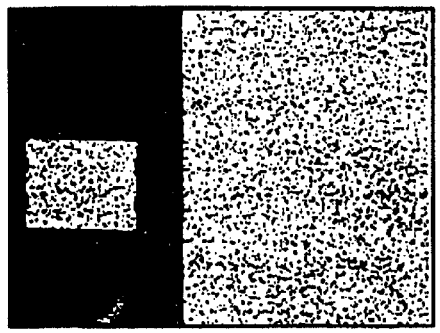
Figure 6C:
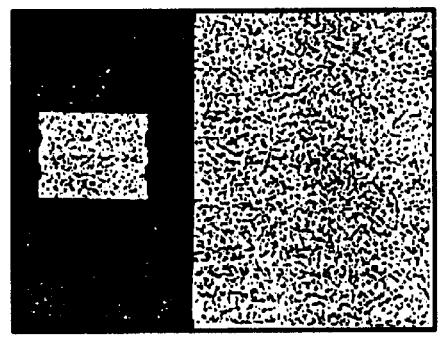
Figure 6D:
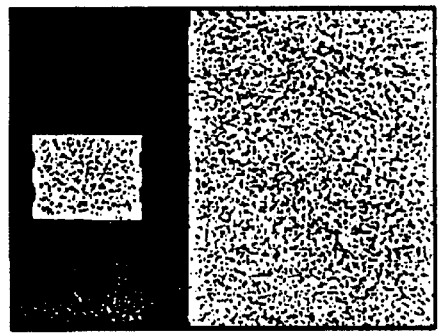
Figure 6E:
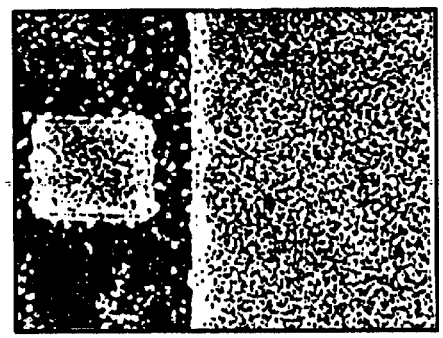
Figure 6F:
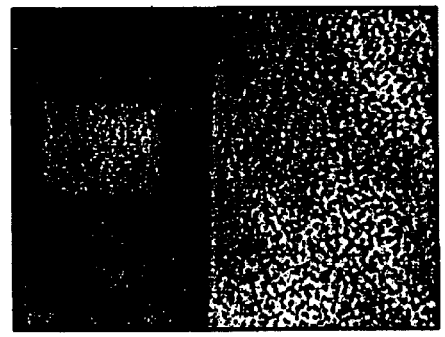

The relation between the process duration and the segregation density is shown in FIG. 5 based on the results obtained in FIGS. 3A to 3F. The tendency of decreasing segregation density with increasing duration of time can be clearly read from the graph shown in FIG. 5. Furthermore, by curve fitting, it can be expected that no holes generate at a time duration exceeding 10 hours. In a pattern having a small short edge, i.e., a pattern 20×100 μm in size, it has been confirmed that an even shorter duration of time is sufficient for the process.

The change in gettering efficiency was studied by means of SIMS (secondary ion mass spectroscopy) analysis. As a result, it has been confirmed that a nickel concentration of about $7 \times 10^{18}$ atoms/cm$^3$ observed for a sample not subjected to any heat treatment was decreased to about $3 \times 10^{18}$ atoms/cm$^3$ by a process for 8 hours. Moreover, for a sample processed for 24 hours and having no etch holes by FPM treatment, the nickel concentration was found to be decreased to a detection limit (i.e., about $5 \times 10^{17}$ atoms/cm$^3$ or lower).

The nickel concentration obtained herein is the result from SIMS analysis performed for a region 30 μm in diameter at the central portion of the pattern 160×200 μm in size. The measured value is expressed by an average value in the vicinity of the central portion in the depth direction of the sample (i.e., because the sample thickness in this experiment is 60 nm, the average value taken at a depth of about 20 to 30 nm).

Thus, from the results obtained on the pattern 160×200 μm in size shown in FIG. 5, it was found that a process duration of 10 hours or longer is preferred for a case doping is performed at an accelerating voltage of 30 keV and at a dose of $5 \times 10^{14}$ ions/cm$^2$, and gettering process is effected at a fixed temperature of 600° C.

However, by taking the throughput of the entire fabrication process into consideration, a too long process duration is not preferred. Thus, the present inventors set the upper limit for the process duration to 10 hours (preferably 8 hours) by taking the heat resistance of the glass substrate and the throughput into consideration.

Then, by considering the heat resistance of the glass substrate and the throughput of the entire fabrication process, the conditions of heat treatment were fixed at 600° C. and at a duration of 8 hours, to thereby investigate the dependence on the parameters of the doping conditions.

Figure 8A:
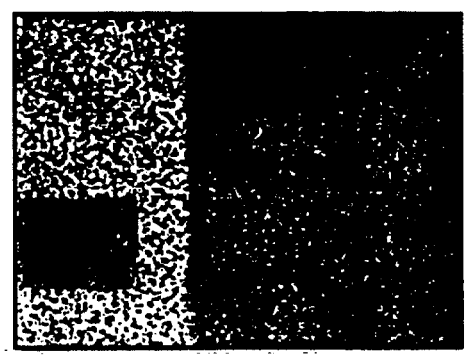
FIGS. 8A to 8F are photographs showing the dose condition dependence of a gettering process.
Figure 8B:
Figure 8C:
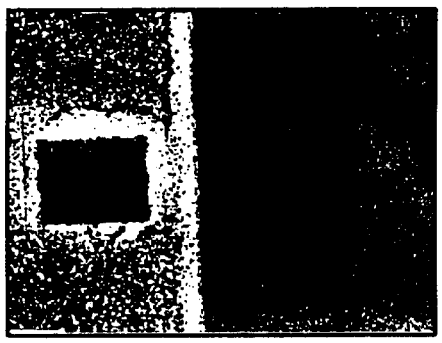
Figure 8D:
Figure 8E:
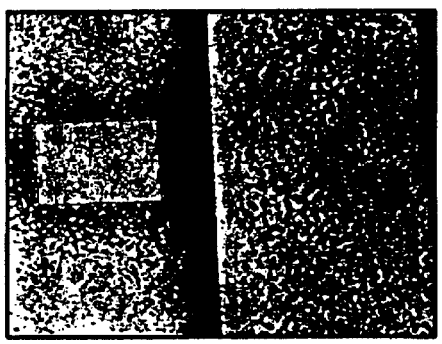
Figure 8F:

Thus, in this case, the accelerating voltage was set to a fixed value of 30 keV, while changing the dose from $1 \times 10^{14}$ ions/cm$^2$ to $5 \times 10^{14}$ ions/cm$^2$ and to $2 \times 10^{15}$ ions/cm$^2$. The results therefor are shown in FIGS. 8A to 8C. Then, the accelerating voltage was set to a fixed value of 10 keV, and the dose was changed from $1 \times 10^{14}$ ions/cm$^2$ to $5 \times 10^{14}$ ions/cm$^2$ and to $2 \times 10^{15}$ ions/cm$^2$. The results thus obtained are shown in FIGS. 8D to 8F. The gettering efficiency was evaluated by the same method described above.

Referring to FIGS. 8A to 8C and FIGS. 8D to 8F, the tendency of decreasing number of holes with increasing dose can be observed in both cases of 10 keV and 30 keV. However, in contrast to the case at an accelerating voltage of 30 keV, where completely no hole was observed to generate at a dose of $2 \times 10^{15}$ ions/cm$^2$, the same was obtained at a lower dose of $5 \times 10^{14}$ ions/cm$^2$ in case an accelerating voltage of 10 keV was applied.

Furthermore, by subjecting the sample obtained without any hole to SIMS analysis, it has been confirmed that the nickel concentration was decreased to a detection limit.

Figure 1:
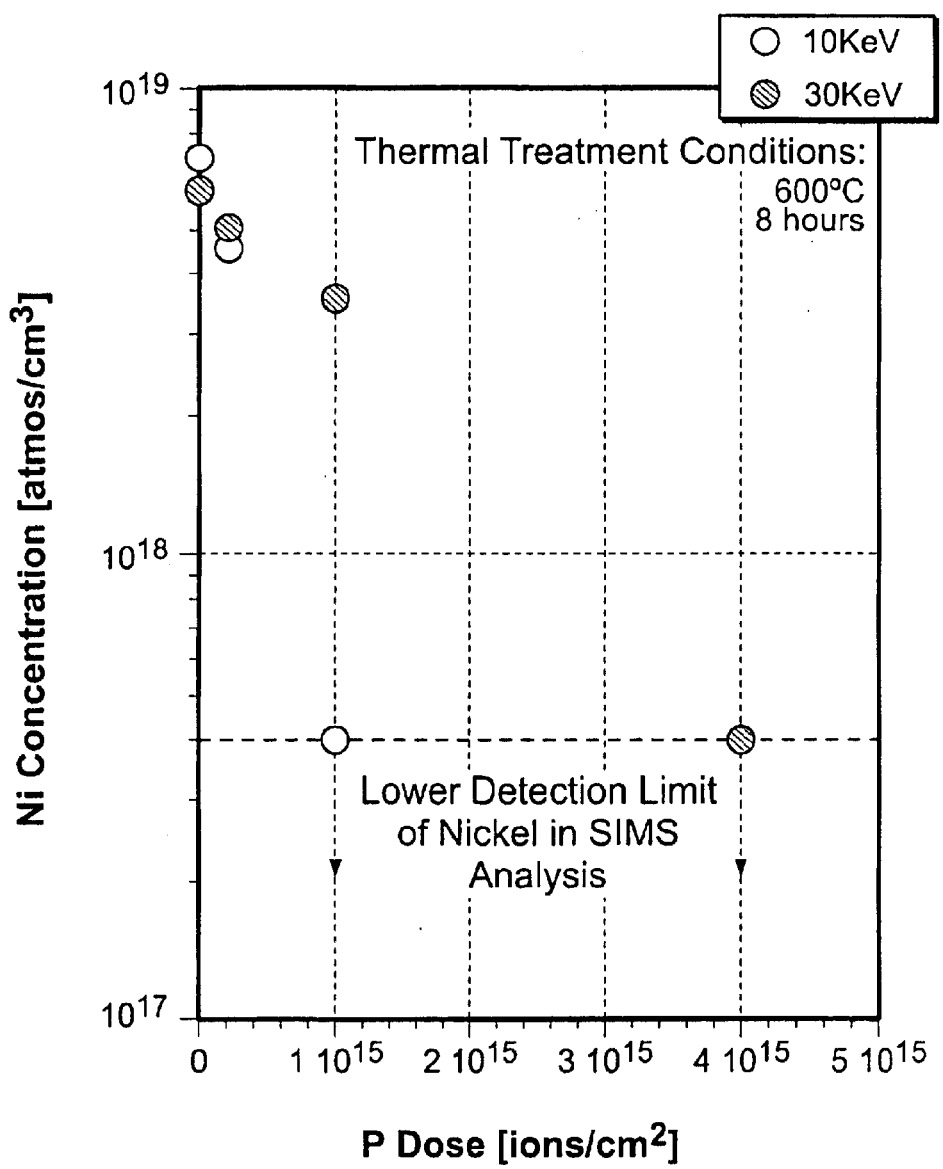
FIG. 1 is a graph showing the relation between a dose amount of phosphorus and nickel concentration.

The results obtained above are summarized in a graph of FIG. 1. Referring to FIG. 1, the abscissa represents the dose of phosphorus, whereas the ordinate shows the concentration of residual nickel remaining in the region to be gettered after subjecting the sample to gettering process. The concentration of nickel was measured by a method described above.

As shown in FIG. 1, in case of 30 Kev, it can be seen that still about $3 \times 10^{18}$ atoms/cm$^3$ of nickel remain even in the case where the dose of phosphorus is set to $5 \times 10^{15}$ ions/cm$^2$. However, it has been confirmed that the nickel concentration can be reduced to a detection limit of SIMS analysis by adding phosphorus at a dose of at least $2 \times 10^{15}$ ions/cm$^2$.

Practically, there is a possibility for lowering the nickel concentration to a detection limit at a lower dose. Although this is not clearly understood from FIG. 1, the present inventors believe that the nickel concentration can be correlated with the dose. If there should be a correlation, for instance, the diffusion rate for nickel and phosphorus in silicon film might be in relation with the dose and the nickel concentration.

On the other hand, at present, it has been confirmed that the nickel concentration can be reduced to a detection limit of SIMS analysis by adding phosphorus at a dose of at least $5 \times 10^{14}$ ions/cm$^2$. However, in actual case, there is a possibility that the nicked concentration may be reduced to a detection limit of SIMS analysis by a lower dose amount.

It is confirmed by SIMS analysis that the reason for the distinct difference between the case where an accelerating voltage of 10 keV is employed and the case where 30 keV is used is due to the difference in ion profile which results upon doping phosphorus ions. More specifically, the concentration of phosphorus that is added into the sample at an accelerating voltage of 10 keV is substantially higher than that at an accelerating voltage of 30 keV. This signifies that more phosphorus which contributes in the gettering is available for the former case.

From the results obtained above, in case that heat treatment for gettering is performed at 600° C. for 8 hours, it can be seen that the desired crystalline silicon film (a film free of any hole when subjected to FPM treatment) can be obtained preferably at an accelerating voltage of 30 keV and at a dose of $2 \times 10^{15}$ ions/cm$^2$ or higher, or at an accelerating voltage of 10 keV and at a dose of $5 \times 10^{14}$ ions/cm$^2$ or higher.

However, from the practical viewpoint, it is anticipated that as the accelerating voltage increases, the load to the doping apparatus increases, and that as the dose increases, throughput thereof impairs. Accordingly, at present, the most referred condition is to employ an accelerating voltage of 10 keV and a dose of $5 \times 10^{14}$ ions/cm$^2$ or higher.

Incidentally, as described above, it has been confirmed that, in the case of an accelerating voltage of 10 keV, the nickel concentration attains the detection limit if the dose is $5 \times 10^{14}$ ions/cm$^2$ or higher. However, the fact may be that a still lower dose is sufficient for attaining the lower detection limit of nickel concentration.

To lower the nickel concentration to a level not influencing the TFT characteristics, i.e., to a concentration of $1 \times 10^{18}$ atoms/cm$^3$ or lower, it is also anticipated by the present inventors that this can be achieved by performing doping of phosphorus at a still lower dose.

Figure 9A:
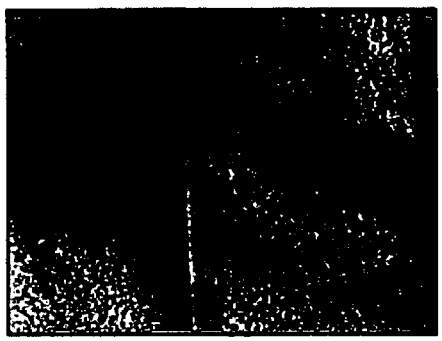
FIGS. 9A and 9B are photographs showing the gettering effect of P and B.
Figure 9B:
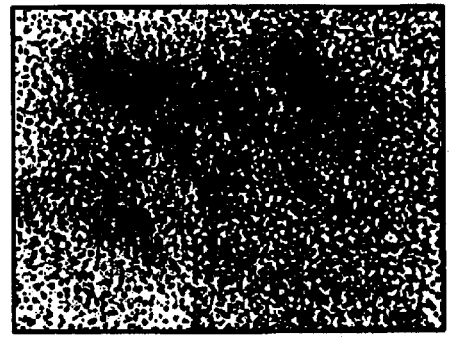

The present inventors conducted a comparative experiment to investigate the effect of a case using a typical element belonging to Group 13, i.e., B (boron), in place of phosphorus. The result is shown in FIGS. 9A and 9B. FIG. 9A shows a photograph for the case in which phosphorus is used as the impurity for gettering, and FIG. 9B shows a photograph for the case using boron.

Doping was performed under an accelerating voltage of 30 keV and a dose of $5\times10^{14}$ ions/cm$^2$, and a heat treatment for gettering was performed at a temperature of 600° C. and for 8 hours. The effect of gettering was evaluated by the method using FPM treatment to observe the etched holes.

Referring to the sample doped with phosphorus as is shown in FIG. 9A, nickel was found to be completely gettered that no hole was observed in the pattern 160×200 μm in size. In contrast to the above, in a sample doped with boron as shown in FIG. 9B, holes were observed uniformly over the entire surface thereof. This tendency was the same for the other elements belonging to Group 13.

As described above, the gettering effect was confirmed to be specific to an element belonging to Group 15 (especially in phosphorus), and that the effect cannot be obtained by an element belonging to Group 13.

Conclusively, the experimental results obtained by the present inventors are as follows. In a gettering process of nickel using phosphorus, the heat treatment for gettering is governed by two important parameters, i.e., the processing temperature and the processing time, whereas in the doping step of phosphorus, the accelerating voltage and the dose are the keys.

According to the experiments of the present inventors, the result is obtained in which a higher temperature yields better results. However, by taking the object of the present invention into consideration, i.e., taking advantage of the low temperature process, the upper limit of the temperature is preferably set to 700° C., more preferably, in the temperature range of from 550 to 650° C., and representatively, at 600° C.) in view of the thermal resistance of the glass substrate.

Although the result indicates that a longer process duration yields better results, by taking the thermal resistance of the glass substrate and the throughput of the fabrication process into consideration, the upper limit thereof is preferably set to 24 hours (more preferably, for 4 to 12 hours, and representatively, 8 hours).

Further, the doping conditions for phosphorus were examined experimentally by setting the thermal treatment conditions to a temperature of 600° C. and for 8 hours. As a result, it was found that the concentration of nickel can be lowered to a detection limit by setting the accelerating voltage to 10 keV and the dose to $5\times10^{14}$ atoms/cm$^3$ or higher.

If the requirement is to be achieved sufficiently by lowering the nickel concentration to $1\times10^{18}$ atoms/cm$^3$ or lower, satisfactory results can be obtained at a dose of $1\times10^{13}$ ions/cm$^2$ or higher (preferably to a dose of from $5\times10^{13}$ atoms/cm$^3$ to $5\times10^{14}$ atoms/cm$^3$).

EXAMPLE 2

The present example describes an example of crystallizing an amorphous semiconductor film by a different method from Example 1 with reference to FIGS. 10A to 10F. The details of this crystallizing means may be referred to Example 2 described in Japanese Patent Application Laid-open No, Hei 7-130652.

Figure 10A:
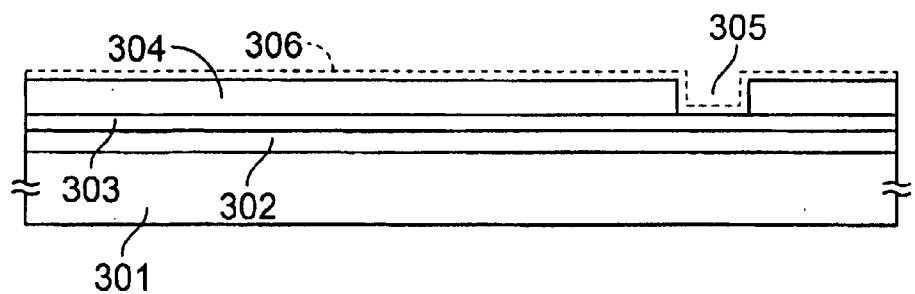
FIGS. 10A to 10F are explanatory views showing the gettering process steps.

Referring to FIG. 10A, reference numeral 301 denotes a glass substrate, and a base film 302 and a 50 nm-thick amorphous silicon film 303 were formed thereon. Then, a silicon oxide film was formed thereon as a mask insulating film 304, and an aperture portion 305 was provided therein to selectively add a catalyst element therethrough (nickel is used again in the present example).

Then, an ultra-thin oxide film (not shown) was formed on the surface of the exposed portion of the amorphous silicon film 303 by irradiating UV light under oxygen atmosphere. This oxide film functions to improve the wettability of the amorphous silicon film. Subsequently, a nickel acetate solution containing 100 ppm (by weight) of nickel was applied to the resulting structure by spin coat to form an ultra-thin nickel-containing layer 306 on the surface of the amorphous silicon film 303 (FIG. 10A).

Figure 10B:
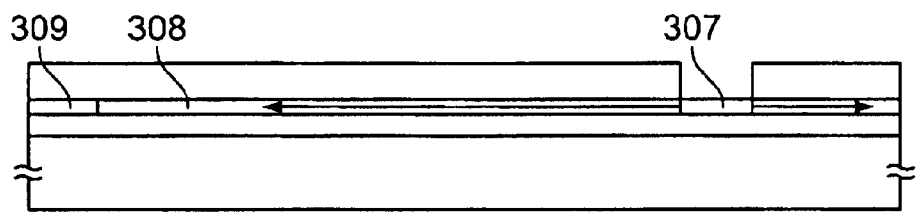

Once a structure shown in FIG. 10A is obtained, a heat treatment at 600° C. under gaseous nitrogen was performed for 8 hours to crystallize the amorphous silicon film 303. The crystallization of the amorphous silicon film 303 proceeds from the region to which nickel was added, to a direction parallel to the film surface (lateral direction) (FIG. 10B).

It is to be noted that a polycrystalline silicon film (polysilicon film) comprising an aggregate of needle-like or columnar shape crystals may be formed in accordance with this crystallization step. The present inventors refer to this crystallized region as a "laterally grown region".

Further, the film thus obtained by crystallization can be classified into three regions of: (1) a nickel-added region 307 (crystalline silicon film); (2) a laterally grown region 308 (crystalline silicon film); and (3) a region without lateral growth 309 (amorphous silicon film). In the description below, no reference is made to the regions other than the laterally grown region 308, because the region that is finally required is the laterally grown region 308 alone.

Figure 10C:
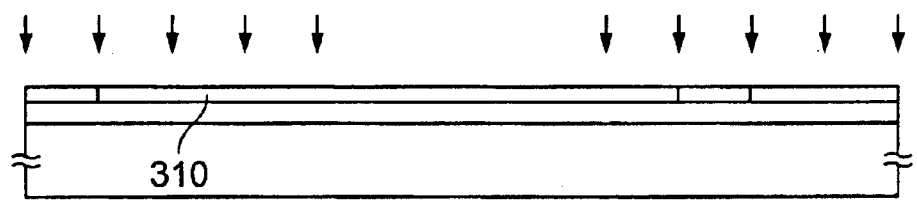

Subsequently a laser irradiation was carried out to the thus obtained crystalline silicon film. As a result, crystalline silicon film 310 considerably improved in crystallinity was obtained from the laterally grown region 308. In the present example, a KrF excimer laser was used (FIG. 10C).

Figure 10D:
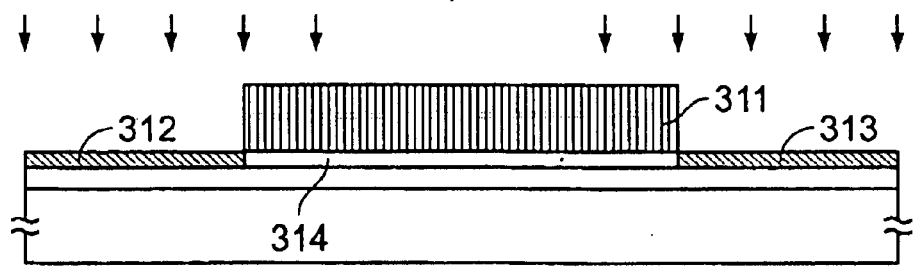

Upon completion of the laser irradiation, a resist mask 311 was formed on the resulting structure to conduct the step of doping P (phosphorus). Doping may be carried out by properly setting the conditions in accordance with Example 1. It is preferred that the conditions are determined by taking the conditions of the heat treatment for the later gettering steps, into consideration (FIG. 10D).

Thus, in the present example, doping was carried out by setting the RF power to 20 W and the accelerating voltage to 10 keV, while setting the dose of phosphorus to $5\times10^{14}$ ions/cm$^3$. Thus, gettering regions 312 and 313 as well as the region to be gettered 314 are formed upon completion of this doping step of phosphorus.

Figure 10E:
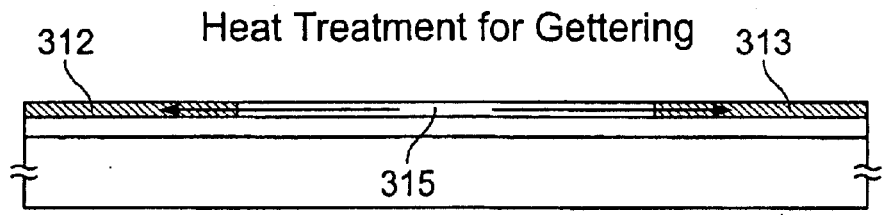

Upon completion of the doping of phosphorus, the resist mask 311 was removed to conduct a heat treatment for gettering. Thus, nickel remaining inside the region to be gettered 314 is allowed to move to the gettering regions 312 and 313 (in the direction indicated by an arrow). Thus was obtained a region to be gettered 315 reduced in concentration of nickel (FIG. 10E).

The heat treatment conditions described above are properly decided in accordance with Example 1 depending on the requirements. However, as stated previously, the upper limits for the process temperature and the processing time must be set by taking the thermal resistance of the glass substrate into consideration.

Figure 10F:
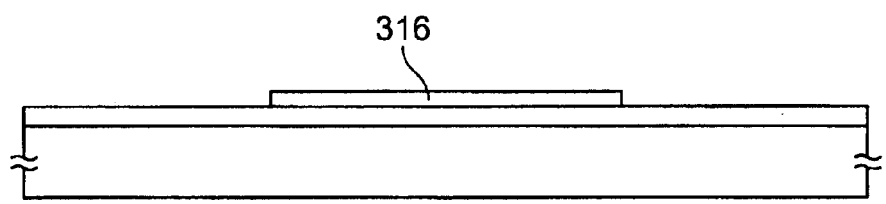

Then, island-like pattern 316 sufficiently lowered in nickel concentration was obtained by removing the gettering regions 312 and 313 by patterning. The peripheral portions in contact with the gettering regions 312 and 313 are preferably removed at the patterning (FIG. 10F).

In case that the crystallizing means according to the present example is employed, the laterally grown region 308 obtained after the crystallization step shown in FIG. 10B has a feature that the nickel concentration therein is lower than that of the region to which nickel was added directly.

That is, because the nickel concentration of the region to be gettered is initially low, the crystallization means according to the present example is more advantageous from the view point of process allowance as compared with the means described in Example 1. More specifically, the process temperature in gettering can be set lower, or the process duration can be shortened.

EXAMPLE 3

The present example refers to a process for manufacturing a CMOS circuit having an N-channel type TFT and a P-channel type TFT provided in a complementary structure.

Figure 11A:
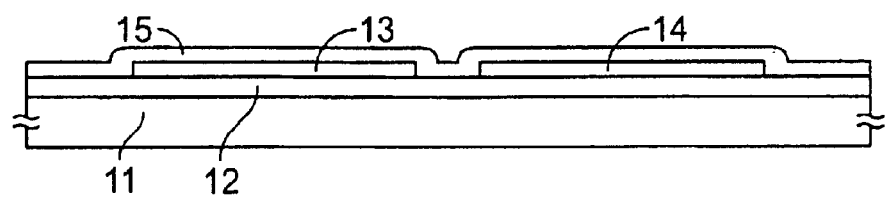
FIGS. 11A to 11E are views showing the fabrication process steps of a TFT.

Referring to FIG. 11A, reference numeral 11 denotes a glass substrate; 12, a base film; 13, an active layer of an N-channel type TFT; and 14, an active layer of a P-channel type. The active layers 13 and 14 may be formed by using, for example, the island-like pattern 212 shown in FIG. 2F.

Then, a 150 nm-thick silicon oxide film was formed by plasma CVD or low pressure thermal CVD to obtain a gate insulating film 15 (FIG. 11A).

A metal film containing aluminum as the principal component was formed thereafter (not shown), and was patterned to provide a prototype for the gate electrode to be used in the later steps. Then, the technique described by the present inventors in Japanese Patent Application Laid-open No. Hei 7-135318 was applied. Thus, porous anodic oxide films 16 and 17, as well as dense anodic oxide films 18 and 19, and gate electrodes 20 and 21 were formed by utilizing the technique described in the above-mentioned patent application.

Figure 11B:
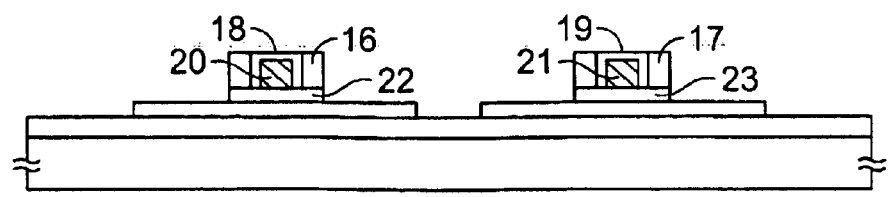
Figure 11C:
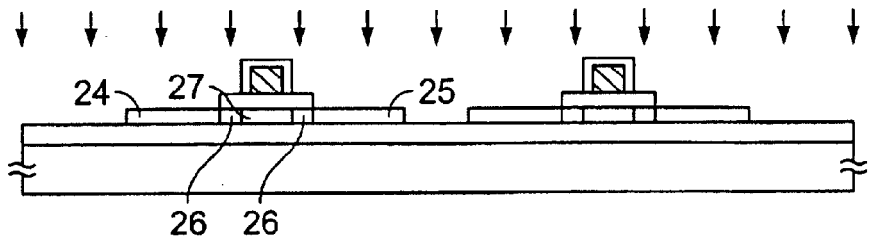

The gate insulating film 15 was etched by using the gate electrodes 20 and 21 as well as the porous anodic oxide films 16 and 17 as masks. Thus were obtained insulating films 22 and 23. Then, the porous anodic oxide films 16 and 17 were removed. Thus, a structure comprising exposed edge portions of gate insulating films 22 and 23 was obtained (FIG. 11B).

Subsequently, impurity ions which impart N-type conductivity were added in two times by means of ion implantation or plasma doping. In the present example, the first addition of impurities was performed at a high accelerating voltage to form an n− region.

In this case, since the accelerating voltage is high, the impurity ions are added not only into the exposed surface of the active layer alone, but also into the lower portion under the edge portion of the thus exposed gate insulating film. The dose of n− region is set such that the n− region may later become a LDD (lightly doped drain) region (containing impurities at a concentration in the range of from about $1 \times 10^{18}$ atoms/cm$^3$ to $1 \times 10^{19}$ atoms/cm$^3$).

The second addition of impurities was then performed at a low accelerating voltage to form an n+ region. Because the accelerating voltage is low in this case, the gate insulating film functions as a mask. Furthermore, because the n+ region functions later as a source/drain region, it is preferably controlled such that the sheet resistance may yield a value of 500 Ω or lower (preferably, 300 Ω or lower).

Thus, a source region 24, a drain region 25, a low concentration impurity region 26, and a channel forming region 27 for a N-channel type TFT were obtained. At this state, the same constitution is obtained for the active layer of the P-channel type TFT (FIG. 1C).

Then, a resist mask 28 was provided in such a manner that it may cover the N-channel type TFT, and impurity ions for imparting P-type conductivity were added. This step was also carried out dividing into two times as in the step of adding impurity described above. It should be noted, however, that the impurity ions should be added at a quantity about two to three times larger than that used in the step of forming the N-channel type TFT, because the conductivity type must be reversed from N-type to P-type.

Figure 11D:
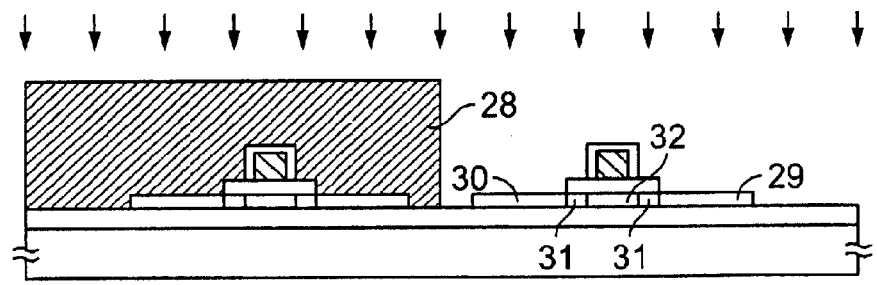

Thus, a source region 29, a drain region 30, a low concentration impurity region 31, and a channel forming region 32 for a P-channel type TFT were obtained (FIG. 11D).

Once the active layer is completed as described above, furnace annealing, laser annealing, or lamp annealing was performed to recover the damage caused during the addition of ions and to activate impurity ions.

Then, an interlayer insulating film 33 was formed at a thickness of 500 nm. For the interlayer insulating film 33, at least one selected from the group of a silicon oxide film, a silicon nitride film, a silicon oxynitride film, an organic resin film, or a laminated film thereof, can be used.

Figure 11E:
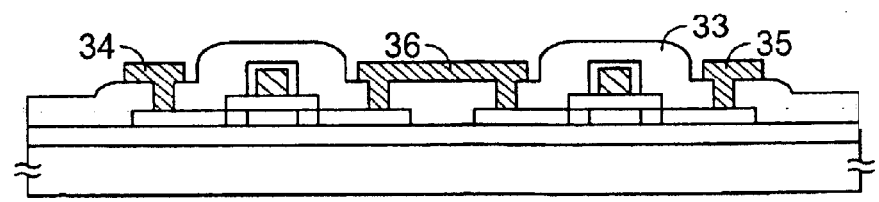

The state shown in FIG. 11E was obtained thereafter by forming contact holes and by forming source lines 34 and 35 as well as a drain line 36. A CMOS circuit was finally obtained by applying thermal treatment under a hydrogen atmosphere to effect hydrogenation of the entire structure.

The CMOS circuit described in the present example is also known as an inverter circuit, and is the basic circuit constituting a semiconductor circuit. By combining such inverter circuits, the basic logic circuits such as a NAND circuit or a NOR circuit can be obtained; or a further complicated logic circuit can be constructed therefrom.

The TFT obtained above contains very little catalyst elements such as nickel in the channel forming regions 27 and 32, or in the junctions at the both ends thereof. Thus, it can be understood that the electric characteristics remain unimpaired by such catalyst elements. Accordingly, a highly reliable TFT, CMOS circuit, or semiconductor circuit can be constructed by the process according to the present invention.

In the following description, the electric characteristics of a TFT (i.e., TFT characteristics) obtained in accordance with the present invention are explained by comparing them with those of a TFT produced without using the technique of the present invention. More specifically, the TFT characteristics referred herein is expressed by plots in a graph shown by taking the gate voltage (Vg) in the abscissa and the drain current (Id) in the ordinate. Thus, this is also called as Id-Vg characteristics (Id-Vg curve).

Figure 12A:
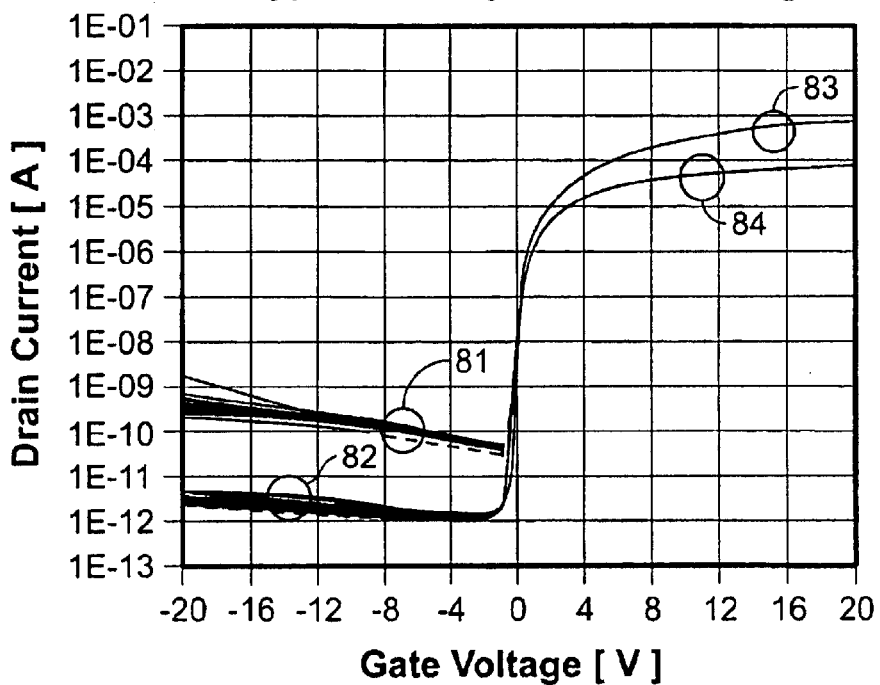
FIGS. 12A and 12B are explanatory diagrams showing the electrical characteristics of TFTs.
Figure 12B:
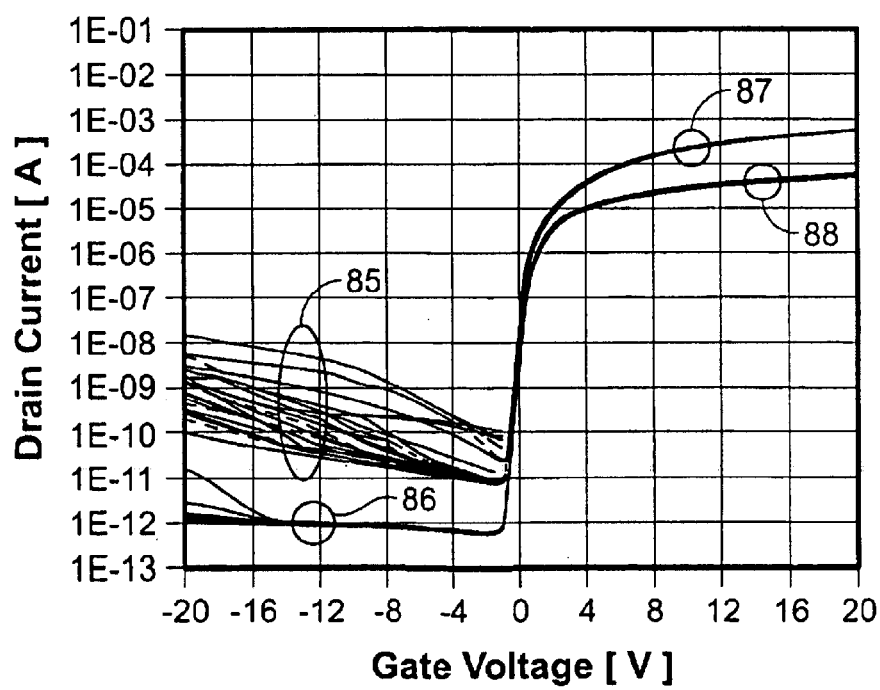

FIGS. 12A and 12B each show the TFT characteristics for an N-channel type TFT, where FIG. 12A is for a TFT subjected to gettering treatment, and FIG. 12B is for a TFT obtained without applying the gettering treatment. The curves in FIGS. 12A and 12B are each obtained by measuring the TFT characteristics for arbitrary chosen 30 TFT units, and by superposing the results thus obtained.

Further, FIGS. 12A and 12B each contain two curves. The curve yielding the higher values shows the data obtained for a drain voltage (Vd) of 14V, and the other curve shows the data obtained for a drain voltage of 1 V. The gate voltage is continuously changed in the range of from −20 V to 20 V, and the corresponding drain current values are read to obtain the data sets.

FIG. 12A shows the data for an N-channel type TFT. Referring first to FIG. 12A, the TFT is in OFF state in the range of from about −20 V to 0 V, but faint OFF current of 81 (in case Vd=14 V) and 82 (Vd=1 V) are observed. The smaller this OFF current is, the better is the TFT characteristics.

As the gate voltage approaches about 0 V, an abrupt change is observed in the drain current. This signifies that the TFT switches to the ON state, and the quicker the change is, the higher the switching performance is.

In the gate voltage ranging from 0 to 20 V, the TFT is in ON state, and ON current of 83 (in case Vd=14 V) and 84 (Vd=1 V) are observed. The ON current 83 and 84 gradually becomes saturated to yield approximately constant values.

Then referring to FIG. 12B, similarly, OFF current 85 (in case Vd=14 V) and 86 (Vd=1 V), as well as ON current 87 (in case Vd=14 V) and 88 (Vd=1 V) are observed. It should be noted that the OFF current behaves differently as compared with the OFF current shown in FIG. 12A.

In other words, the OFF current 81 and 82 in FIG. 12A both exhibit a relatively uniform value, whereas the OFF current in FIG. 12B, particularly the OFF current 85, shows considerable fluctuation.

According to the knowledge of the present inventors, the catalyst element such as nickel remaining in the active layer of a TFT segregate to form a current leak path. Thus, the aforementioned fluctuation in OFF current of a TFT is believed to occur, when the active layer having such a current leak path forms the TFT.

The electric characteristics of a TFT shown in FIG. 12B surely shows such a state, and assumably, the fluctuation in OFF current is due to the presence of catalyst elements remaining in the active layer. However, in case the catalyst element remaining in the active layer is subjected to gettering by using the present invention, it can be understood from FIG. 12A that the fluctuation in OFF current is clearly prevented from occurring.

Although the explanation with reference to FIGS. 12A and 12B was made on an N-channel TFT, similar results are also obtained for a P-channel TFT.

Figure 13A:
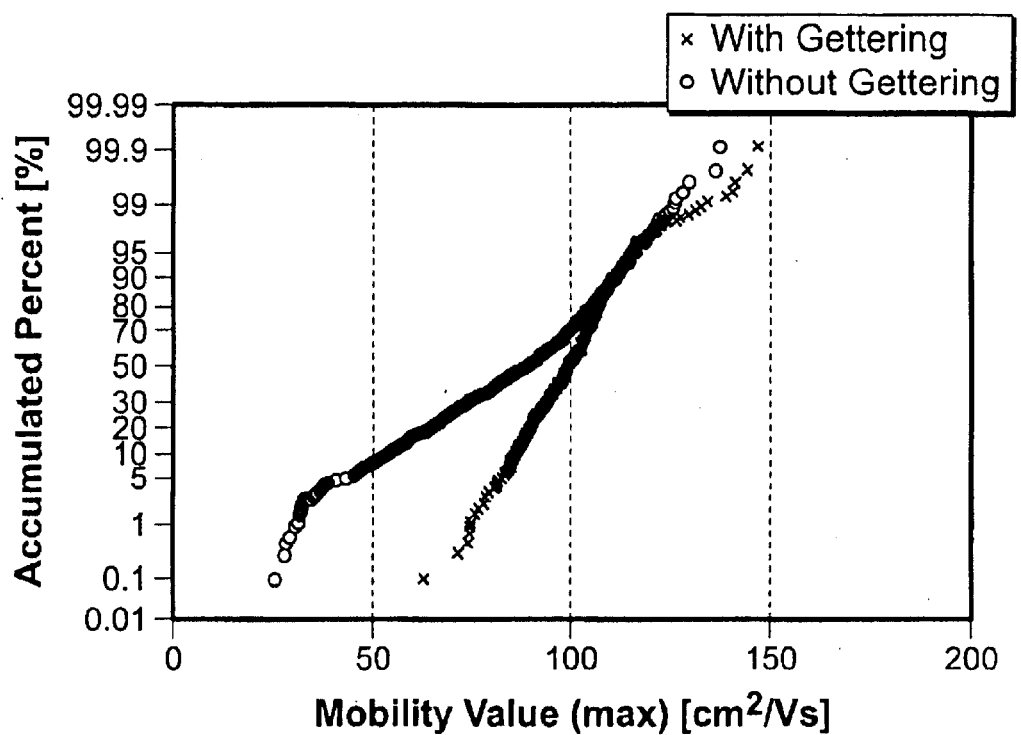
FIGS. 13A and 13B are explanatory diagrams showing the electrical characteristics of TFTs.
Figure 13B:
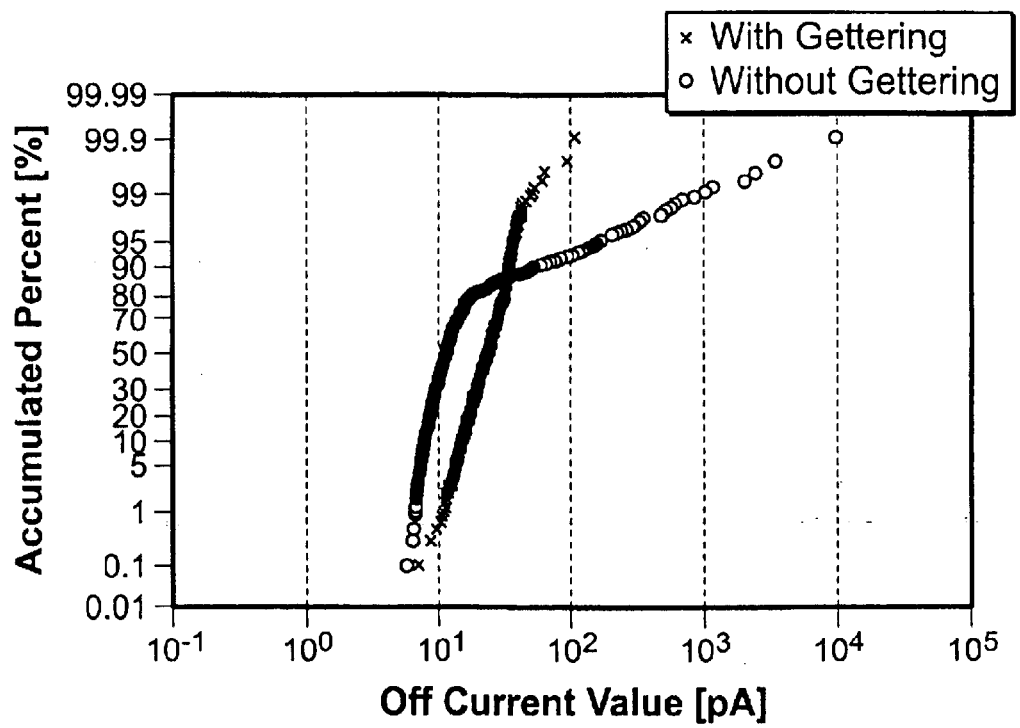

FIGS. 13A and 13B show the fluctuation in electric characteristics of FIGS. 12A and 12B in a numerically converted form. The graph of FIG. 13A shows the normal probability distribution of the value of mobility (field effect mobility), and FIG. 13B shows the same of the OFF current, which are both obtained from data sets for 540 pieces of TFTs.

The graphs described above are effective for evaluating the fluctuation in TFT characteristics. Referring to FIG. 13B, for instance, the OFF current values for the TFTs subjected to gettering treatment exhibit a fluctuation in current values falling within a range of several pA (pico amperes) to several tens of pA, whereas those for the TFTs without applying the gettering treatment show a fluctuation over a wide range of several pA to several nA (nano amperes).

That is, if the data group is seen as a straight line, the greater the gradient is, the less the fluctuation is, and the data can be considered to be distributed in accordance with normal distribution (Gaussian distribution). On the other hand, the smaller the gradient is, the larger the fluctuation is, and the data distribution is far from being normal distribution.

Thus, in FIG. 13B, the data obtained on TFTs subjected to gettering treatment are distributed in accordance with normal distribution, whereas those obtained on TFTs not subjected to gettering treatment deviate from normal distribution. More specifically, in case no gettering treatment is applied, about 80% (i.e., about 430 units) of 540 units of TFTs fall with a fluctuation in TFT characteristics of about 10 pA, but the rest, i.e., about 110 units, yield a large fluctuation as such differing by one to two digits.

The results described above clearly shows that the formation of leak path ascribed to the segregation of catalyst elements, which accelerate the crystallization, is considerably prevented by applying the gettering treatment.

Referring to the data group for mobility value shown in FIG. 13A, it can be clearly understood that the fluctuation is smaller for the data obtained on TFTs subjected to gettering treatment. Although the maximum value for mobility remains independent to the gettering treatment, it can be understood that the lack of gettering treatment produces TFTs having an extremely small mobility value.

The fact described above assumably suggests the presence of a high energy barrier which hinders the movement of carriers in the active layers (particularly in the channel forming regions) of the TFTs not subjected to gettering treatment.

The present inventors believe that the above-described fact can be explained as follows. In general, the matching in bonding among the crystalline grains is poor at the grain boundaries included in polysilicon films and the like, and hence a high energy barrier is formed. This energy barrier functions as obstacles which prevent the movement of the carriers during the operation of TFT, thereby lowering the mobility.

In the process described in Example 1, the catalytic effect of nickel is used intentionally so that nickel is assumed to segregate in the grain boundaries of the crystalline silicon film. Then, in the grain boundaries, the dangling bonds of silicon are bonded with nickel so as to form silicides by forming bonds such as Si—Ni—Si.

Thus, although the details of the mechanism still remain to be solved, the present inventors considered that the energy barrier at the grain boundaries is lowered due to some causes during the process of removing nickel. For instance, there might be accepted such a model that, if gettering treatment is performed in such a state that silicides are formed in the manner described above, the bonding between nickel and silicon may be cut to newly form a recombination between the dangling bonds of neighboring silicon atoms.

Accordingly, by taking the results shown in FIG. 13B into consideration, the gettering treatment according to the present invention differs from the conventional gettering treatment designed for simply removing impurity elements. That is, the gettering treatment of the present invention is completely novel in that it has an effect of not only removing catalyst elements, but also improving the crystallinity of crystalline semiconductor, particularly the matching of the grain boundaries.

Figure 14:
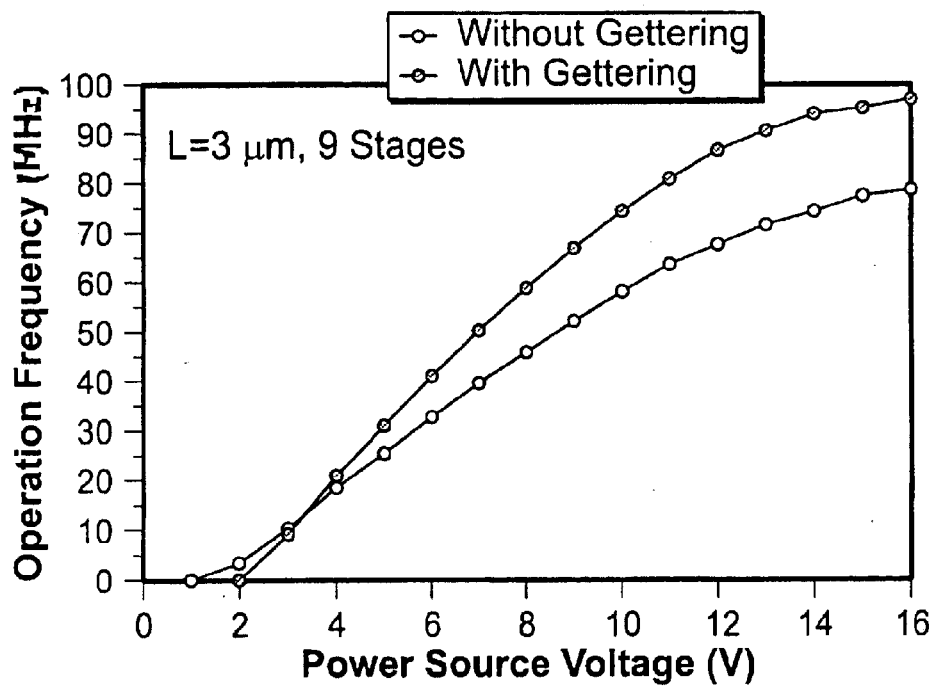
FIG. 14 is a graph showing the results measured by a ring oscillator.

Then, the present inventors connected in series odd number of CMOS circuits (inverter circuits) shown in FIG. 11E to form a ring oscillator. As is clearly observed from the measurement results given in FIG. 14, the prototype ring oscillator stably worked in the source voltage range of from 0 to 16 V, and attained an operation frequency of about 100 MHz. Furthermore, the ring oscillator using the present invention achieved a higher operation frequency.

It can be seen from the results described above that the resent invention has no negative effects on the TFT characteristics and on the characteristics of a semiconductor circuit.

EXAMPLE 4

The present example refers to a process for manufacturing a TFT having a structure differing from that described in Example 3. More specifically, it refers to a case of manufacturing a reversed stagger type TFT, i.e., a typical example of a bottom gate type TFT.

Figure 15A:
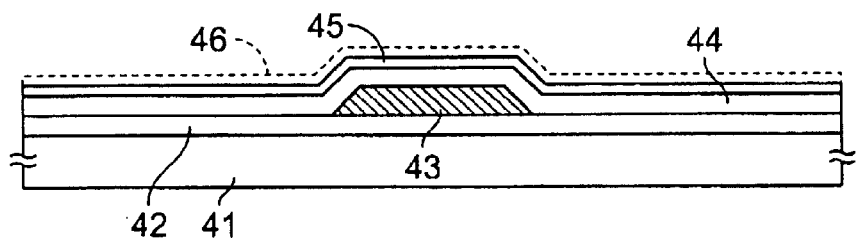
FIGS. 15A to 15F are views showing the fabrication process steps of a TFT.

FIG. 15A shows a structure comprising a glass substrate 41, a base film 42, a gate electrode made of an electrically conductive material 43, a gate insulating film 44, an amorphous silicon film 45, and a nickel-containing layer 46 formed in the same manner as in Example 1 (FIG. 15A).

It should be kept in mind that gettering is performed by furnace annealing in the temperature range of from 500 to 700° C. in the later step. Thus, it is required to use a material well resistant to the aforementioned temperature for the gate electrode 43.

Figure 15B:
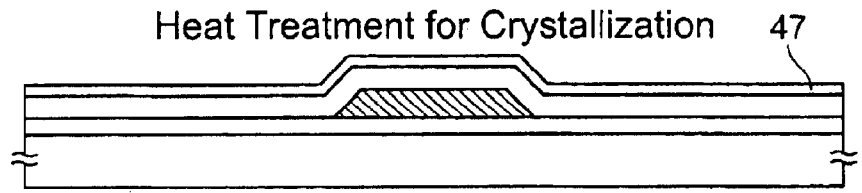

Then, heat treatment for crystallization was performed to form a crystalline silicon film 47. The same conditions as those used in Example 1 can be utilized for the heat treatment (FIG. 15B).

Figure 15C:
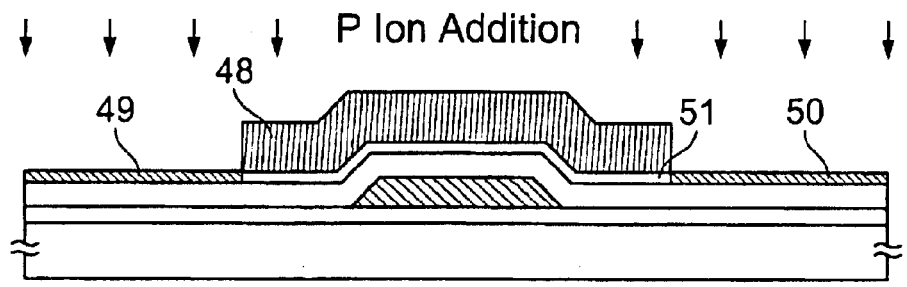

Then, an element (phosphorus is used in this example again) for the gettering of nickel was added after providing a resist mask 48. Thus, gettering regions 49 an 50, as well as a region to be gettered 51 were formed in this step (FIG. 15C).

Figure 15D:
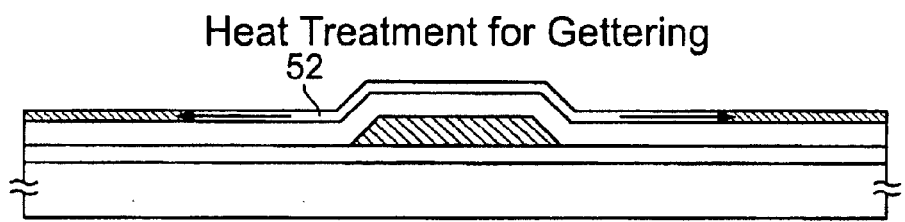

Heat treatment was performed thereafter for the gettering. Thus, nickel remaining inside the region to be gettered 51 is allowed to move to the gettering regions 49 and 50 in the direction indicated by an arrow. Thus was obtained a crystalline silicon film (a region to be gettered) 52 reduced in concentration of nickel (FIG. 15D).

Then, the region to be gettered 52 obtained by the gettering step described above was patterned to form an active layer 53. A channel stopper (otherwise called as etching stopper) 54 was provided on the active layer 53 by patterning a silicon nitride film (FIG. 15E).

Figure 15E:
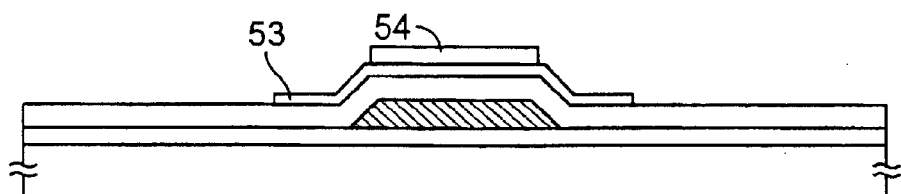
Figure 15F:
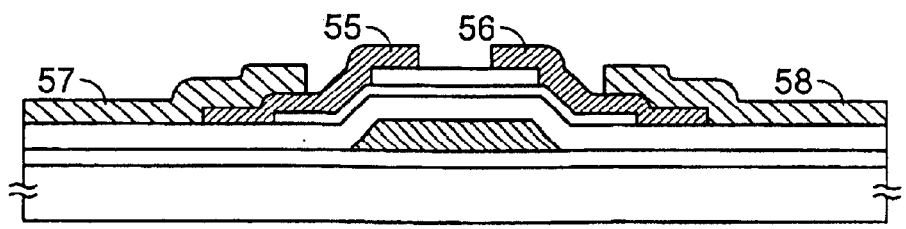

Once the state shown in FIG. 15E is obtained, a crystalline silicon film having N-type conductivity was formed and patterned to form source region; 55 and drain region 56. Then, source line 57 and drain line 58 were formed. Finally, a reversed stagger type TFT shown in FIG. 15F was obtained by subjecting the resulting structure to hydrogenation.

EXAMPLE 5

As described in Example 3, the present invention has a great effect in reducing the fluctuation in OFF current. This is an effect particularly valuable in case of manufacturing an electro-optical device such as a liquid crystal display device using TFTs.

Conventionally proposed as a solution to the problem of fluctuation in OFF current is the multi-gate structure. A multi-gate structure comprises placing, on a single active layer, a plurality of gate electrodes forming short circuit. Thus, such a structure is substantially constructed from a plurality of TFTs connected in series.

In the structure described above, even in a case where a single TFT should exhibit an abnormal OFF current, if the rest of the TFTs operate normally, the entire operation of the circuit is rate-controlled by the normally functioning TFTs. That is, as a whole, the fluctuation in OFF current can be suppressed. A higher effect can be achieved by increasing the number of gates, but there is a disadvantage that the resulting TFT is increased in size.

On the other hand, the pixel matrix circuits which provide the image display regions of a liquid crystal display device are required that the fluctuation in OFF current is minimized as much as possible. To meet this requirement, widely used at present is the multi-gate structure. However, it is also demanded to achieve a high aperture ratio for a pixel matrix circuit of a transmission type liquid crystal display device.

Thus, in the conventional multi-gate structure, it had been found difficult to satisfy the demand of high aperture ratio.

However, because the TFT according to the present invention exhibits extremely small fluctuation in OFF current, it can be used sufficiently in a TFT having a single gate structure. As a matter of course, it can be used in a multi-gate structure to reduce the number of gates.

Accordingly, electric characteristics considerably small in OFF current can be attained by using the TFT according to the present invention, though minimizing its size. This is particularly effective in increasing the aperture ratio of a pixel matrix circuit.

EXAMPLE 6

The present example relates to a case of constituting an electro-optical device using the TFT according to the present invention. In the description below, reference is made to a case of applying it to a liquid crystal display device of an active matrix type. However, it can be applied to, for example, an EL display device or an EC display device of an active matrix type.

Figure 16:
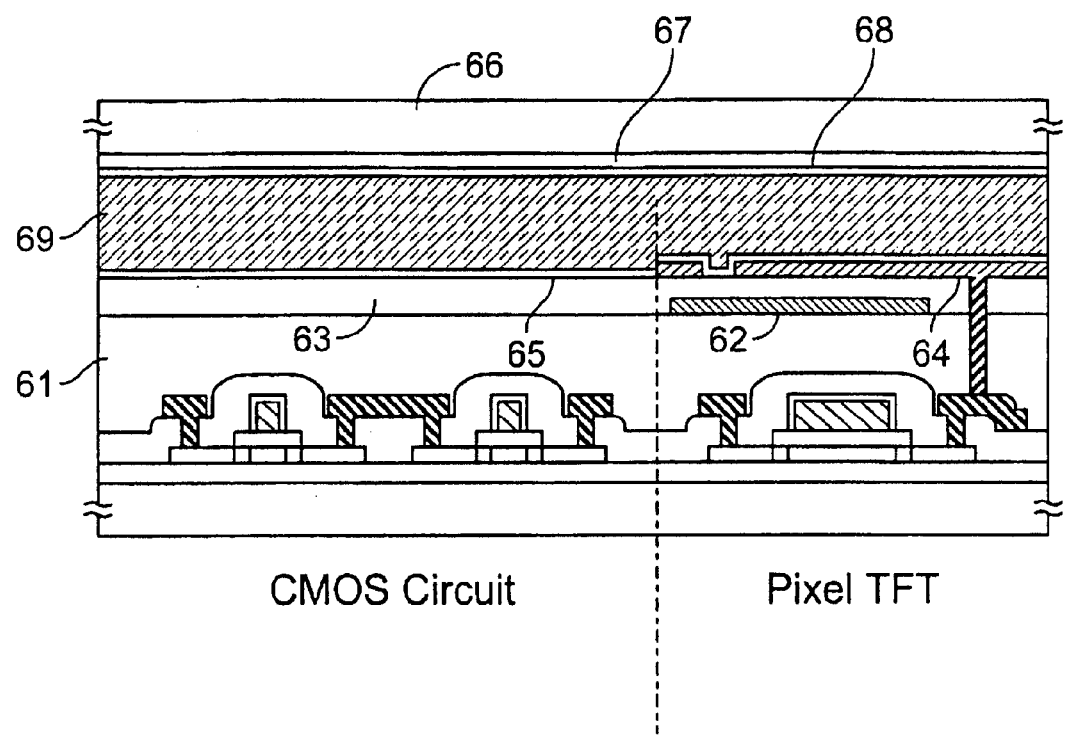
FIG. 16 shows a cross-sectional structure of a liquid crystal display device.

FIG. 16 shows a schematically shown cross sectional view of an active matrix type liquid crystal device. There are shown a CMOS circuit in the region constituting driver circuits and logic circuits, and a pixel TFT in the region constituting the pixel matrix circuit.

Description has been made of the structure of the CMOS circuit (TFT structure) in Example 3. Thus, only necessary portions are described in the present example.

First, the CMOS circuit shown in the left side of FIG. 16 was completed in accordance with the process of manufacturing a CMOS circuit described in Example 3. In this case, the structure of the pixel TFT is basically the same as that of the TFT constituting the CMOS circuit. As a matter of course, the pixel TFT alone can be formed in a multi-gate structure, or the length of the LDD region can be changed, depending on requirements.

An interlayer insulating film 61 made of an organic resin film was provided on the CMOS circuit, and a black mask 62 was placed thereon. In the present example, the black mask 62 was provided only on the upper side of the pixel matrix circuit, but it may be placed on the upper side of the CMOS circuit.

Another interlayer insulating film 63 was formed on the black mask 62 again, and a pixel electrode 64 was placed by providing a contact hole. In case of a reflection type display device, the pixel electrode 64 is provided by using a reflecting film such as an aluminum film; in case of a transmission type display device, a transparent electrically conductive film such as an ITO film is used for the pixel electrode 64. For the uppermost layer, an orientation film 65 was provided to obtain the constitution of an active matrix substrate. An active matrix substrate refers to the substrate having a TFT formed thereon.

The structure further comprises an opposing substrate 66, an opposing electrode 67 made of a transparent electrically conductive film, and an orientation film 68 on the opposing side. Thus, an active matrix type liquid crystal display device shown in FIG. 16 can be completed by interposing a liquid crystal layer 69 between the active matrix substrate and the opposing substrate.

Figure 17:
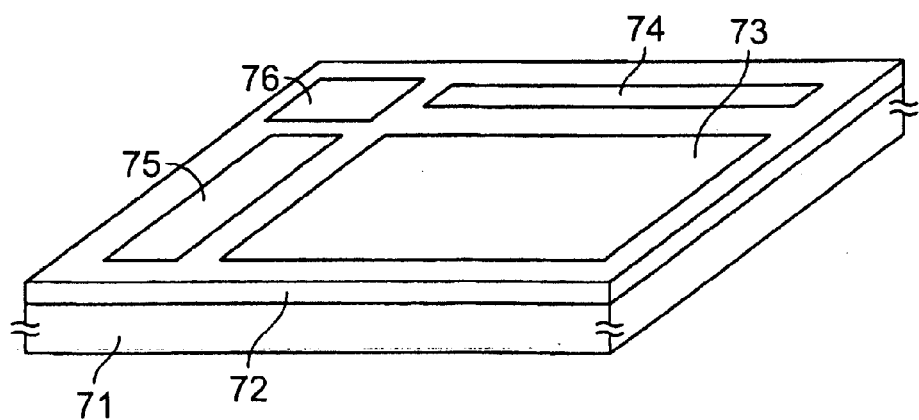
FIG. 17 shows a constitution of an active matrix substrate.

FIG. 17 shows a schematic outer appearance of an active matrix type liquid crystal device which comprises a glass substrate 71, a base film 72, a pixel matrix circuit 73, a source driver circuit 74, a gate driver circuit 75, and a logic circuit 76.

The logic circuit 76 in a broader sense includes all the logic circuits constructed by TFTs, however, in the present example, it refers to circuits other than the pixel matrix circuit and the driver circuit, just for identification.

EXAMPLE 7

The present example shows, by making reference to FIGS. 18A to 18F, examples of application products (electronic devices) using the electro-optical devices produced in accordance with the present invention. Application products utilizing the present invention include a video camera, a still camera, a projector, a head mount display, a car navigation system, a personal computer, and personal mobile information terminals (i.e., a mobile computer, a personal handy phone, etc.).

Figure 18A:
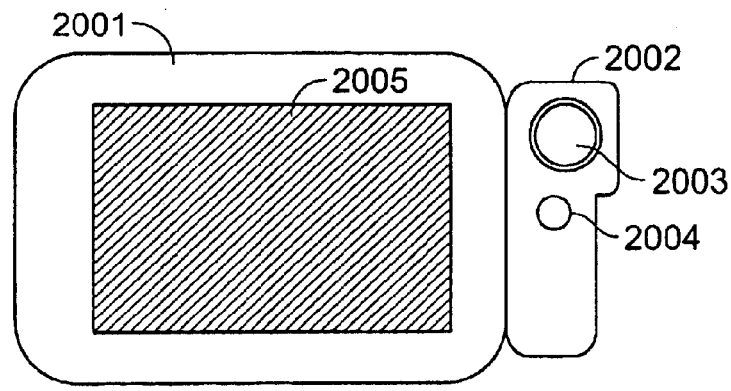
FIGS. 18A to 18F are each an example of application products to which the present invention may be applied.

FIG. 18A shows a mobile computer comprising a main body 2001, a camera unit 2002, an image receiving unit 2003, an operation switch 2004, and a display device 2005. The present invention is applied to the display device 2005.

Figure 18B:
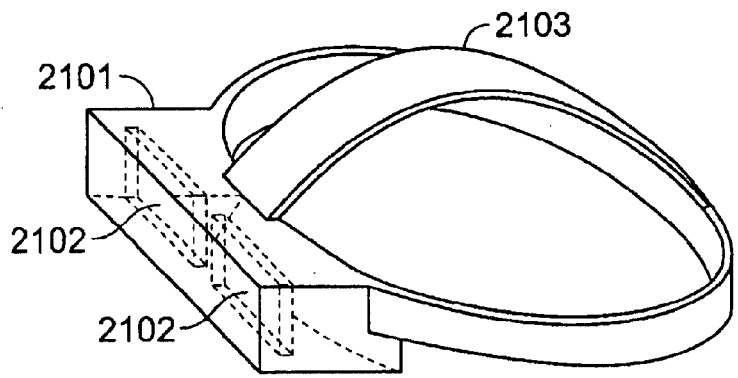

FIG. 18B shows a head mount display comprising a main body 2101, a display device 2102, and a band unit 2103. The present invention is applied to the display device 2102.

Figure 18C:
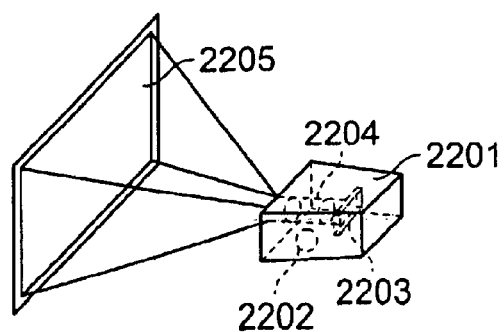

FIG. 18C shows a front type projector comprising a main body 2201, a light source 2202, a display device 2203, an optical system 2204, and a screen 2205. The present invention is applied to the display device 2203.

Figure 18D:
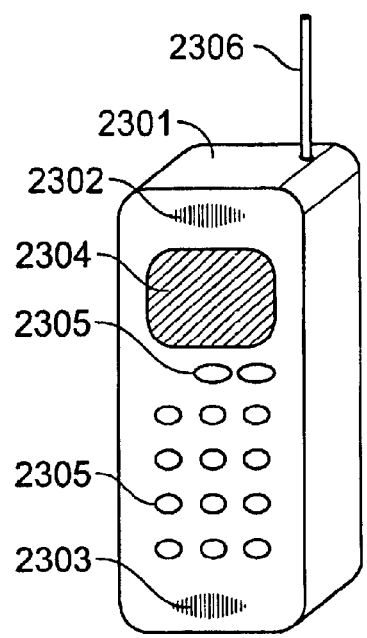

FIG. 18D shows a personal handy phone comprising a main body 2301, a voice output unit 2302, a voice input unit 2303, a display device 2304, an operation switch 2305, and an antenna 2306. The present invention is applied to the display device 2304.

Figure 18E:
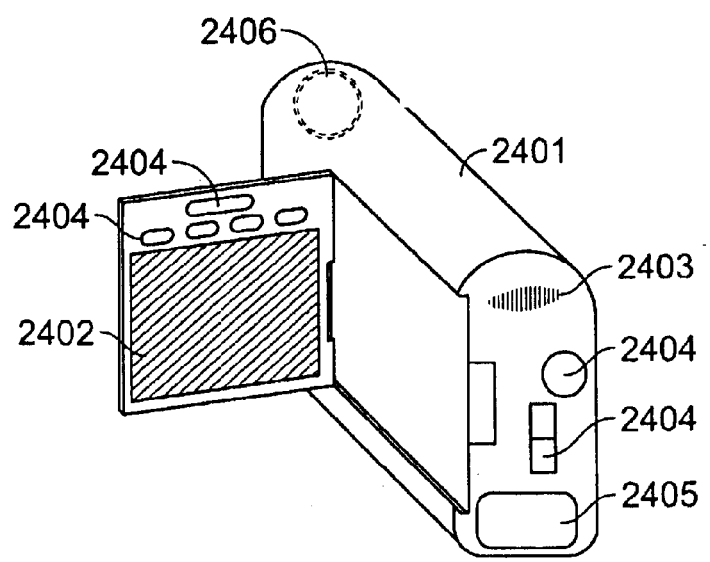

FIG. 18E shows a video camera comprising a main body 2401, a display device 2402, a voice input unit 2403, an operation switch 2404, a battery 2405, and an image receiving unit 2406. The present invention is applied to the display device 2402.

Figure 18F:
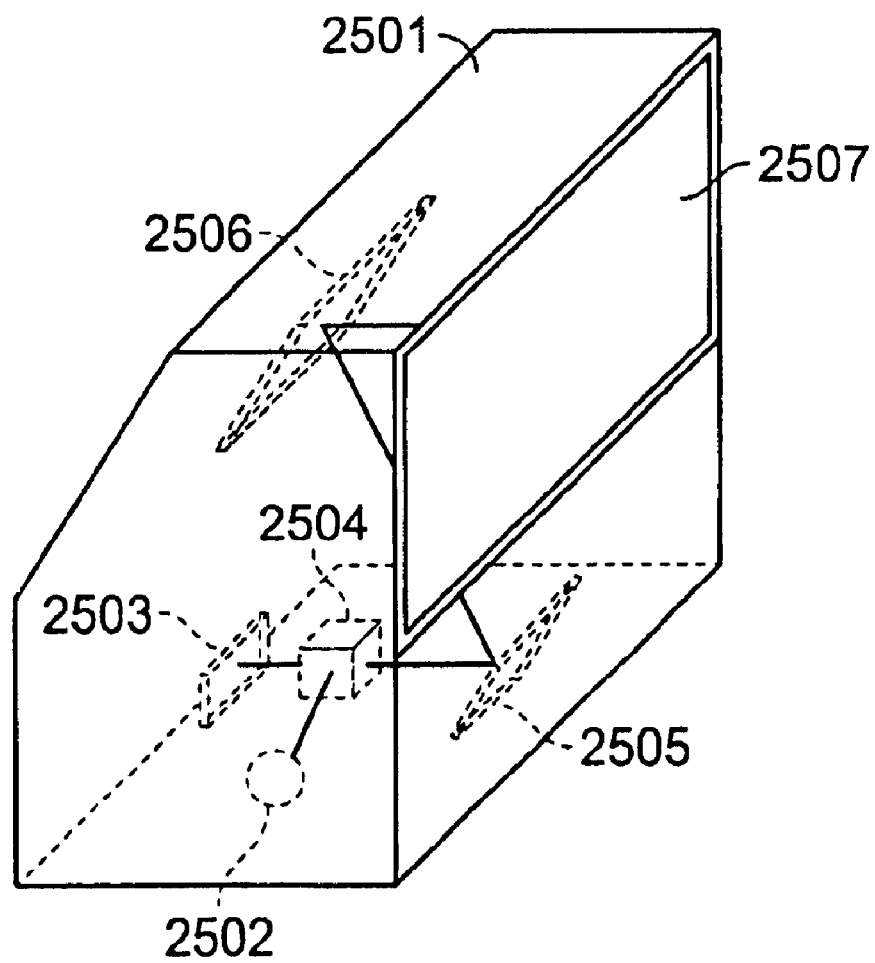

FIG. 18F shows a rear type projector comprising a main body 2501, a light source 2502, a display device 2503, a polarization beam splitter 2504, reflectors 2505 and 2506, and a screen 2507. The present invention is applied to the display device 2503.

As described above, the application field of the present invention is extremely wide, and the present invention is thus applicable to display media of any field. In particular, in case a liquid crystal device is used in a projection type display device such as a projector, an extremely high resolution is required. The present invention is particularly effective in such cases.

By using the technique according to the present invention, catalyst elements can be efficiently removed or lowered in its concentration from a crystalline semiconductor film obtained by using a catalyst element for promoting the crystallization of the semiconductor. Furthermore, because the gettering process according to the present invention is performed at a temperature not higher than the thermal resistance (glass transition) temperature of the glass substrate, the conventional low temperature process can be effectively utilized.

The crystalline semiconductor film obtained by using the present invention is particularly improved in crystallinity by the effect of the catalyst element, and the concentration of the used catalyst element is lowered to a sufficiently low concentration by performing gettering process. Thus, when used as an active layer of a semiconductor device, the crystalline semiconductor film according to the present invention provides semiconductor device having superior electrical characteristics and high reliability.

What is claimed is:

1. A method of manufacturing a semiconductor device including at least a thin film transistor, said method comprising the steps of:
    forming an amorphous semiconductor film comprising silicon over a substrate having an insulating surface;
    providing the amorphous semiconductor film with an element which promotes crystallization of the amorphous semiconductor film;
    crystallizing the amorphous semiconductor film by a first heat treatment to form a crystalline semiconductor film;
    introducing an impurity element belonging to Group 15 into a first portion of the crystalline semiconductor film by using a mask while a second portion of the crystalline semiconductor film below the mask is not provided with the impurity element;
    wherein the first and second portions of the crystalline semiconductor film are in contact with the insulating surface over the substrate;
    performing a second heat treatment for gettering so that the element contained in the second portion is moved to the first portion in a direction parallel to the insulating surface; and
    patterning the crystallized semiconductor film to form a crystalline semiconductor island in the second portion thereby removing the first portion of the crystalline semiconductor film;
    forming an active layer of the thin film transistor using the crystalline semiconductor island;
    wherein the second heat treatment is performed in a temperature range not exceeding a glass transition point of the substrate.

2. A method according to claim 1, wherein the crystalline semiconductor film has grain boundaries.

3. A method according to claim 1, wherein the second heat treatment is performed in the temperature range from 500 to 700° C.

4. A method according to claim 1, wherein the substrate is a glass substrate.

5. A method according to claim 1, wherein the second heat treatment is furnace annealing.

6. A method according to claim 1, wherein the amorphous semiconductor film comprises germanium.

7. A method according to claim 1, wherein the element which promotes crystallization is at least one element selected from the group of elements consisting of Ni, Co, Fe, Pd, Pt, Cu and Au.

8. A method according to claim 1, wherein the impurity element belonging to Group 15 is at least one element selected from the group of elements consisting of P, N, As, Sb, and Bi.

9. A method of manufacturing a semiconductor device including at least a thin film transistor, said method comprising the steps of:
    forming an amorphous semiconductor film comprising silicon over a substrate having an insulating surface;
    selectively providing a first portion of the amorphous semiconductor film with an element which promotes crystallization of the amorphous semiconductor film;
    crystallizing the amorphous semiconductor film by a first heat treatment to form a crystalline semiconductor film, so that a crystallization proceeds from the first portion in a lateral direction to the insulating surface;

introducing an impurity element belonging to Group 15 into a second portion of the crystalline semiconductor film by using a mask while a third portion of the crystalline semiconductor film below the mask is not provided with the impurity element;

wherein the second and third portions of the crystalline semiconductor film are in contact with the insulating surface over the substrate;

performing a second heat treatment for gettering so that the element contained in the third portion is moved to the second portion in a lateral direction to the insulating surface; and patterning the crystalline semiconductor film to form a crystalline semiconductor island in the third portion thereby removing the second portion of the crystalline semiconductor film;

forming an active layer of the thin film transistor using the crystalline semiconductor island;

wherein the second heat treatment is performed in a temperature range not exceeding a glass transition point of the substrate.

10. A method according to claim 9, wherein the crystalline semiconductor film has grain boundaries.

11. A method according to claim 9, wherein the second heat treatment is performed in the temperature range from 500 to 700° C.

12. A method according to claim 9, wherein the substrate is a glass substrate.

13. A method according to claim 9, wherein the second heat treatment is furnace annealing.

14. A method according to claim 9, wherein the amorphous semiconductor film comprises germanium.

15. A method according to claim 9, wherein the element which promotes crystallization is at least one element selected from the group of elements consisting of Ni, Co, Fe, Pd, Pt, Cu and Au.

16. A method according to claim 9, wherein the impurity element belonging to Group 15 is at least one element selected from the group of elements consisting of P, N, As, Sb, and Bi.

17. A method of manufacturing a semiconductor device including at least a thin film transistor, said method comprising the steps of:

forming an amorphous semiconductor film comprising silicon over a substrate having an insulating surface;

providing the amorphous semiconductor film with an element which promotes crystallization of the amorphous semiconductor film;

crystallizing the amorphous semiconductor film by a first heat treatment to form a crystalline semiconductor film;

irradiating a laser light or an intense light to the crystalline semiconductor film;

introducing an impurity element belonging to Group 15 into a first portion of the crystalline semiconductor film by using a mask after the irradiating step, while a second portion of the crystalline semiconductor film below the mask is not provided with the impurity element;

wherein the first and second portions of the crystalline semiconductor film are in contact with the insulating surface over the substrate;

performing a second heat treatment for gettering so that the element contained in the second portion is moved to the first portion in a lateral direction to the insulating surface;

patterning the crystalline semiconductor film to form a crystalline semiconductor island in the second portion thereby removing the first portion of the crystalline semiconductor film;

forming an active layer of the thin film transistor using the crystalline semiconductor island;

wherein the second heat treatment is performed in a temperature range not exceeding a glass transition point of the substrate.

18. A method according to claim 17, wherein the crystalline semiconductor film has grain boundaries.

19. A method according to claim 17, wherein the second heat treatment is performed in the temperature range from 500 to 700° C.

20. A method according to claim 17, wherein the substrate is a glass substrate.

21. A method according to claim 17, wherein the second heat treatment is furnace annealing.

22. A method according to claim 17, wherein the amorphous semiconductor film comprises germanium.

23. A method according to claim 17, wherein the element which promotes crystallization is at least one element selected from the group of elements consisting of Ni, Co, Fe, Pd, Pt, Cu and Au.

24. A method according to claim 17, wherein the impurity element belonging to Group 15 is at least one element selected from the group of elements consisting of P, N, As, Sb, and Bi.

25. A method of manufacturing a semiconductor device including at least a thin film transistor, said method comprising the steps of:

forming an amorphous semiconductor film comprising silicon over a substrate having an insulating surface;

selectively providing a first portion of the amorphous semiconductor film with an element which promotes crystallization of the amorphous semiconductor film;

crystallizing the amorphous semiconductor film by a first heat treatment to form a crystalline semiconductor film, so that a crystallization proceeds from the first portion of the amorphous semiconductor film in a lateral direction to the insulating surface;

irradiating a laser light or an intense light to the crystalline semiconductor film;

introducing an impurity element belonging to Group 15 into a second portion of the crystalline semiconductor film by using a mask after the irradiating step, while a third portion of the crystalline semiconductor film below the mask is not introduced with the impurity element;

wherein the second and third portions of the crystalline semiconductor film are in contact with the insulating surface over the substrate;

performing a second heat treatment for gettering so that the element contained in the third portion is moved to the second portion in a lateral direction to the insulating surface;

patterning the crystalline semiconductor film to form a crystalline semiconductor island in the third portion thereby removing the second portion of the crystalline semiconductor film;

forming an active layer of the thin film transistor using the crystalline semiconductor island;

wherein the second heat treatment is performed in the temperature range not exceeding a glass transition point of the substrate.

26. A method according to claim 25, wherein the crystalline semiconductor film has grain boundaries.

27. A method according to claim 25, wherein the second heat treatment is performed in the temperature range from 500 to 700° C.

28. A method according to claim 25, wherein the substrate is a glass substrate.

29. A method according to claim 25, wherein the second heat treatment is furnace annealing.

30. A method according to claim 25, wherein amorphous semiconductor film comprises germanium.

31. A method according to claim 25, wherein the element which promotes crystallization is at least one element selected from the group of elements consisting of Ni, Co, Fe, Pd, Pt, Cu and Au.

32. A method according to claim 25, wherein the impurity element belonging to Group 15 is at least one element selected from the group of elements consisting of P, N, As, Sb, and Bi.

33. A method according to claim 1, wherein said step of introducing the impurity element belonging to Group 15 is performed by plasma doping.

34. A method according to claim 8, wherein a dose of said phosphorous (P) is set in a range from $1\times10^{13}$ ions/cm$^2$ to $5\times10^{14}$ ions/cm$^2$.

35. A method according to claim 8, wherein a concentration of said phosphorous is a digit higher than a concentration of said element which promotes crystallization.

36. A method according to claim 9, wherein said step of introducing the impurity element belonging to Group 15 is performed by plasma doping.

37. A method according to claim 16, wherein a dose of said phosphorous is set in a range from $1\times10^{13}$ ions/cm$^2$ to $5\times10^{14}$ ions/cm$^2$.

38. A method according to claim 16, wherein a concentration of said phosphorous is a digit higher than a concentration of said element which promotes crystallization.

39. A method according to claim 17, wherein said step of introducing the impurity element belonging to Group 15 is performed by plasma doping.

40. A method according to claim 24, wherein a dose of said phosphorous is set in a range from $1\times10^{13}$ ions/cm$^2$ to $5\times10^{14}$ ions/cm$^2$.

41. A method according to claim 24, wherein a concentration of said phosphorus is a digit higher than a concentration of said element which promotes crystallization.

42. A method according to claim 25, wherein said step of introducing the impurity element belonging to Group 15 is performed by plasma doping.

43. A method according to claim 32, wherein a dose of said phosphorous is set in a range from $1\times10^{13}$ ions/cm$^2$ to $5\times10^{14}$ ions/cm$^2$.

44. A method according to claim 32, wherein a concentration of said phosphorous is a digit higher than a concentration of said element which promotes crystallization.

45. A method of manufacturing a semiconductor device including at least a thin film transistor, said method comprising the steps of:

forming an amorphous semiconductor film comprising silicon over a substrate having an insulating surface;

providing the amorphous semiconductor film with an element which promotes crystallization of the amorphous semiconductor film;

crystallizing the amorphous semiconductor film by a first heat treatment to form a crystalline semiconductor film;

introducing an impurity element belonging to Group 15 into a first portion of the crystalline semiconductor film by using a mask while a second portion of the crystalline semiconductor film below the mask is not provided with the impurity element;

wherein the first and second portions of the crystalline semiconductor film are in contact with the insulating surface over the substrate;

performing a second heat treatment for gettering so that the element contained in the second portion is moved to the first portion in a lateral direction to the insulating surface;

patterning the crystalline semiconductor film to form a crystalline semiconductor island in the second portion thereby removing the first portion of the crystalline semiconductor film;

forming a gate insulating film over the crystalline semiconductor island;

forming at least one gate electrode comprising a metal on the gate insulating film;

doping an impurity element into at least a second portion of the crystalline semiconductor island to form a lightly doped drain region; and forming at least a source region and a drain region by doping an impurity element into third portions of the crystalline semiconductor island;

wherein the second heat treatment is performed in a temperature range not exceeding a glass transition point of the substrate.

46. A method according to claim 45, wherein the second heat treatment is performed in the temperature range from 500 to 700° C.

47. A method according to claim 45, wherein the element which promotes crystallization is at least one element selected from the group of elements consisting of Ni, Co, Fe, Pd, Pt, Cu and Au.

48. A method according to claim 45, wherein the impurity element belonging to Group 15 is at least one element selected from the group of elements consisting of P, N, As, Sb, and Bi.

49. A method according to claim 45, wherein said step of introducing the impurity element belonging to Group 15 is performed by plasma doping.

50. A method according to claim 48, wherein a dose of said phosphorus is set in a range from $1\times10^{13}$ ions/cm$^2$ to $5\times10^{14}$ ions/cm$^2$.

51. A method according to claim 48, wherein a concentration of said phosphorous is a digit higher than a concentration of said element which promotes crystallization.

52. A method of manufacturing a semiconductor device including at least a thin film transistor, said method comprising the steps of:

forming an amorphous semiconductor film comprising silicon over a substrate having an insulating surface;

providing the amorphous semiconductor film with an element which promotes crystallization of the amorphous semiconductor film;

crystallizing the amorphous semiconductor film by a first heat treatment to form a crystalline semiconductor film;

introducing an impurity element belonging to Group 15 into a first portion of the crystalline semiconductor film by using a mask while a second portion of the crystalline semiconductor film below the mask is not provided with the impurity element;

performing a second heat treatment for gettering so that the element contained in the second portion is moved to the first portion in a lateral direction to the insulating surface;

patterning the crystalline semiconductor film to form a crystalline semiconductor island in the second portion thereby removing the first portion of the crystalline semiconductor film;

forming a gate insulating film over the crystalline semiconductor island;

forming at least one gate electrode comprising a metal on the gate insulating film;

doping an impurity element into at least a second portion of the crystalline semiconductor island to form a lightly doped drain region;

forming at least a source region and a drain region by doping an impurity element into third portions of the crystalline semiconductor island;

forming an interlayer insulating film comprising silicon over the gate electrode;

forming an interlayer insulating film comprising an organic resin film over the interlayer insulating film; and forming a pixel electrode that is electrically connected to the source region or drain region through a contact hole over the interlayer film;

wherein the second heat treatment is performed in a temperature range not exceeding a glass transition point of the substrate.

53. A method according to claim 52, wherein the second heat treatment is performed in the temperature range from 500 to 700° C.

54. A method according to claim 52, wherein the amorphous semiconductor film comprises germanium.

55. A method according to claim 52, wherein the element which promotes crystallization is at least one element selected from the group of elements consisting of Ni, Co, Fe, Pd, Pt, Cu and Au.

56. A method according to claim 52, wherein the impurity element belonging to Group 15 is at least one element selected from the group of elements consisting of P, N, As, Sb, and Bi.

57. A method according to claim 52, wherein said step of introducing the impurity element belonging to Group 15 is performed by plasma doping.

58. A method according to claim 56, wherein a dose of said phosphorous is set in a range from $1\times10^{13}$ ions/cm$^2$ to $5\times10^{14}$ ions/cm$^2$.

59. A method according to claim 56, wherein a concentration of said phosphorous is a digit higher than a concentration of said element which promotes crystallization.

60. A method according to claim 45, wherein the amorphous semiconductor film comprises germanium.

61. A method according to claim 1, wherein the element in the crystalline semiconductor island after the second heat treatment has a concentration in a range of $1\times10^{18}$ atoms/cm$^3$ or lower.

62. A method according to claim 9, wherein the element in the crystalline semiconductor island after the second heat treatment has a concentration in a range of $1\times10^{18}$ atoms/cm$^3$ or lower.

63. A method according to claim 17, wherein the element in the crystalline semiconductor island after the second heat treatment has a concentration in a range of $1\times10^{18}$ atoms/cm$^3$ or lower.

64. A method according to claim 25, wherein the element in the crystalline semiconductor island after the second heat treatment has a concentration in a range of $1\times10^{18}$ atoms/cm$^3$ or lower.

65. A method according to claim 45, wherein the element in the crystalline semiconductor island after the second heat treatment has a concentration in a range of $1\times10^{18}$ atoms/cm$^3$ or lower.

66. A method according to claim 52, wherein the element in the crystalline semiconductor island after the second heat treatment has a concentration in a range of $1\times10^{18}$ atoms/cm$^3$ or lower.

67. A method of manufacturing a semiconductor device including at least a thin film transistor, said method comprising the steps of:

forming an amorphous semiconductor film on an insulating surface;

providing the amorphous semiconductor film with an element which promotes crystallization of the amorphous semiconductor film;

performing a first heat treatment to crystallize the amorphous semiconductor film;

introducing an impurity element belonging to Group 15 into a first portion of the crystalline semiconductor film by using a mask while a second portion of the crystalline semiconductor film below the mask is not provided with the impurity element;

wherein the first and second portions of the crystalline semiconductor film are in contact with the insulating surface over the substrate;

performing a second heat treatment for gettering so that the element contained in the first portion is moved to the second portion in a direction parallel to the insulating surface;

patterning the crystallized semiconductor film to form a crystalline semiconductor island in the second portion thereby removing the first portion of the crystalline semiconductor film; and forming an active layer of the thin film transistor using the crystalline semiconductor island.

68. A method according to claim 67, herein the crystalline inductor film has grain boundaries.

69. A method according to claim 67, wherein the second heat treatment is performed in the temperature range from 500 to 700° C.

70. A method according to claim 67, wherein the second heat treatment is furnace annealing.

71. A method according to claim 67, wherein the element which promotes crystallization is at least one element selected from the group of elements consisting of Ni, Co, Fe, Pd, Pt, Cu and Au.

72. A method according to claim 67, wherein the impurity element belonging to Group 15 is at least one element selected from the group of elements consisting of P, N, As, Sb, and Bi.

73. A method of manufacturing a semiconductor device including at least a thin film transistor, said method comprising the steps of:

forming an amorphous semiconductor film on an insulating surface;

providing the amorphous semiconductor film with an element which promotes crystallization of the amorphous semiconductor film;

performing a first heat treatment to crystallize the amorphous semiconductor;

irradiating a laser light or an intense light to the crystalline semiconductor film;

introducing an impurity element belonging to Group 15 into a first portion of the crystalline semiconductor film by using a mask after the irradiating step, while a second portion of the crystalline semiconductor film below the mask is not provided with the impurity element;

wherein the first and second portions of the crystalline semiconductor film are in contact with the insulating surface over the substrate;

performing a second heat treatment for gettering so that the element contained in the second portion is moved to the first portion in a lateral direction to the insulating surface;

patterning the crystalline semiconductor film to form a crystalline semiconductor island in the second portion thereby removing the first portion of the crystalline semiconductor film; and forming an active layer of the thin film transistor using the crystalline semiconductor island.

74. A method according to claim 73, wherein the crystalline semiconductor film has grain boundaries.

75. A method according to claim 73, wherein the second heat treatment is performed in the temperature range from 500 to 700° C.

76. A method according to claim 73, wherein the second heat treatment is furnace annealing.

77. A method according to claim 73, wherein the element which promotes crystallization is at least one element selected from the group of elements consisting of Ni, Co, Fe, Pd, Pt, Cu and Au.

78. A method according to claim 73, wherein the impurity element belonging to Group 15 is at least one element selected from the group of elements consisting of P, N, As, Sb, and Bi.

79. A method of manufacturing a semiconductor device including at least a thin film transistor, said method comprising the steps of:

forming an amorphous semiconductor film on an insulating surface;

providing the amorphous semiconductor film with an element which promotes crystallization of the amorphous semiconductor film;

performing a first heat treatment to crystallize the amorphous semiconductor film;

introducing an impurity element belonging to Group 15 into a first portion of the crystalline semiconductor film by using a mask while a second portion of the crystalline semiconductor film below the mask is not provided with the impurity element;

wherein the first and second portions of the crystalline semiconductor film are in contact with the insulating surface over the substrate;

performing a second heat treatment for gettering so that the element contained in the second portion is moved to the first portion in a direction parallel to the insulating surface;

forming a crystalline semiconductor island by removing the first portion and a part of the second portion; and forming an active layer of the thin film transistor using the crystalline semiconductor island.

80. A method according to claim 79, wherein the crystalline semiconductor film has grain boundaries.

81. A method according to claim 79, wherein the second heat treatment is performed in the temperature range from 500 to 700° C.

82. A method according to claim 79, wherein the second heat treatment is furnace annealing.

83. A method according to claim 79, wherein the element which promotes crystallization is at least one element selected from the group of elements consisting of Ni, Co, Fe, Pd, Pt, Cu and Au.

84. A method according to claim 79, wherein the impurity element belonging to Group 15 is at least one element selected from the group of elements consisting of P, N, As, Sb, and Bi.

85. A method of manufacturing a semiconductor device including at least a thin film transistor, said method comprising the steps of:

forming an amorphous semiconductor film on an insulating surface;

providing the amorphous semiconductor film with an element which promotes crystallization of the amorphous semiconductor film;

performing a first heat treatment to crystallize the amorphous semiconductor;

irradiating a laser light or an intense light to the crystalline semiconductor film;

introducing an impurity element belonging to Group 15 into a first portion of the crystalline semiconductor film by using a mask after the irradiating step, while a second portion of the crystalline semiconductor film below the mask is not provided with the impurity element;

wherein the first and second portions of the crystalline semiconductor film are in contact with the insulating surface over the substrate;

performing a second heat treatment for gettering so that the element contained in the second portion is moved to the first portion in a lateral direction to the insulating surface;

forming a crystalline semiconductor island by removing the first portion and a part of the second portion; and forming an active layer of the thin film transistor using the crystalline semiconductor island.

86. A method according to claim 85, wherein the crystalline semiconductor film has grain boundaries.

87. A method according to claim 85, wherein the second heat treatment is performed in the temperature range from 500 to 700° C.

88. A method according to claim 85, wherein the second heat treatment is furnace annealing.

89. A method according to claim 85, wherein the element which promotes crystallization is at least one element selected from the group of elements consisting of Ni, Co, Fe, Pd, Pt, Cu and Au.

90. A method according to claim 85, wherein the impurity element belonging to Group 15 is at least one element selected from the group of elements consisting of P, N, As, Sb, and Bi.

91. A method according to claim 1, wherein the element which promotes crystallization is provided with the amorphous semiconductor layer by introducing into the amorphous semiconductor film or applying a layer containing the element to the amorphous semiconductor film.

92. A method according to claim 9, wherein the element which promotes crystallization is provided with the amorphous semiconductor layer by introducing into the amorphous semiconductor film or applying a layer containing the element to the amorphous semiconductor film.

93. A method according to claim 17, wherein the element which promotes crystallization is provided with the amorphous semiconductor layer by introducing into the amorphous semiconductor film or applying a layer containing the element to the amorphous semiconductor film.

94. A method according to claim 25, wherein the element which promotes crystallization is provided with the amorphous semiconductor layer by introducing into the amorphous semiconductor film or applying a layer containing the element to the amorphous semiconductor film.

95. A method according to claim 45, wherein the element which promotes crystallization is provided with the amorphous semiconductor layer by introducing into the amorphous semiconductor film or applying a layer containing the element to the amorphous semiconductor film.

96. A method according to claim 52, wherein the element which promotes crystallization is provided with the amorphous semiconductor layer by introducing into the amorphous semiconductor film or applying a layer containing the element to the amorphous semiconductor film.

97. A method according to claim 67, wherein the element which promotes crystallization is provided with the amorphous semiconductor layer by introducing into the amorphous semiconductor film or applying a layer containing the element to the amorphous semiconductor film.

98. A method according to claim 73, wherein the element which promotes crystallization is provided with the amorphous semiconductor layer by introducing into the amorphous semiconductor film or applying a layer containing the element to the amorphous semiconductor film.

99. A method according to claim 79, wherein the element which promotes crystallization is provided with the amorphous semiconductor layer by introducing into the amorphous semiconductor film or applying a layer containing the element to the amorphous semiconductor film.

100. A method according to claim 85, wherein the element which promotes crystallization is provided with the amorphous semiconductor layer by introducing into the amorphous semiconductor film or applying a layer containing the element to the amorphous semiconductor film.

* * * * *